US009843008B2

(12) United States Patent
Kato et al.

(10) Patent No.: US 9,843,008 B2
(45) Date of Patent: Dec. 12, 2017

(54) ORGANIC ELECTROLUMINESCENT ELEMENT AND ELECTRONIC DEVICE

(71) Applicant: Konica Minolta, Inc., Tokyo (JP)

(72) Inventors: Kazuki Kato, Tokyo (JP); Toshihiko Iwasaki, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/120,313

(22) PCT Filed: Feb. 27, 2015

(86) PCT No.: PCT/JP2015/055902
§ 371 (c)(1),
(2) Date: Aug. 19, 2016

(87) PCT Pub. No.: WO2015/151684
PCT Pub. Date: Oct. 8, 2015

(65) Prior Publication Data
US 2017/0069863 A1    Mar. 9, 2017

(30) Foreign Application Priority Data

Apr. 3, 2014    (JP) ................. 2014-076799

(51) Int. Cl.
*H01L 51/50*    (2006.01)
*H05B 33/14*    (2006.01)
(Continued)

(52) U.S. Cl.
CPC ........ *H01L 51/504* (2013.01); *H01L 27/3209* (2013.01); *H01L 51/5012* (2013.01);
(Continued)

(58) Field of Classification Search
CPC ............... H01L 51/504; H01L 27/3209; H01L 51/5012; H01L 51/5016; H01L 51/5278;
(Continued)

(56) References Cited

U.S. PATENT DOCUMENTS

2012/0205684 A1* 8/2012 Yamazaki ........... H01L 27/3209
257/89
2014/0252340 A1* 9/2014 Wang .................. H01L 51/0085
257/40

FOREIGN PATENT DOCUMENTS

JP    2006012793 A    1/2006
JP    2012204093 A    10/2012
(Continued)

OTHER PUBLICATIONS

Ikawa et al., "White polymer light-emitting diodes co-doped with phosphorescent iridium complexes bearing the same cyclometalated ligand", Phys. Status Solidi C 9, No. 12, 2553-2556 (2012).*
Eom, "White phosphorescent organic light-emitting devices with dual triple-doped emissive layers." Appl. Phys. Lett. 94, 153303 (2009).*
S. Ikawa, et al; White polymer light-emitting diodes co-doped with three phosphorescent . . . ; Journal of Luminescence; vol. 155; Nov. 2014.
(Continued)

*Primary Examiner* — Peter Bradford
(74) *Attorney, Agent, or Firm* — Lucas & Mercanti, LLP

(57) ABSTRACT

There is constituted an organic electroluminescent element, including: an anode; a cathode; and a light-emitting layer sandwiched between the anode and the cathode, wherein at least two kinds or more of light-emitting dopants each of which exhibits an emission spectrum having a peak in a region of a wavelength of 580 nm or more are contained in the light-emitting layer.

6 Claims, 3 Drawing Sheets

(51) Int. Cl.
*H01L 51/52* (2006.01)
*H01L 27/32* (2006.01)
*H01L 51/00* (2006.01)

(52) U.S. Cl.
CPC ...... *H01L 51/5016* (2013.01); *H01L 51/5278* (2013.01); *H05B 33/14* (2013.01); *H01L 51/005* (2013.01); *H01L 51/006* (2013.01); *H01L 51/0058* (2013.01); *H01L 51/0059* (2013.01); *H01L 51/0067* (2013.01); *H01L 51/0072* (2013.01); *H01L 51/0085* (2013.01)

(58) Field of Classification Search
CPC ............... H01L 51/005; H01L 51/0058; H01L 51/0059; H01L 51/006; H01L 51/0067; H01L 51/0072; H01L 51/0085; H05B 33/14
See application file for complete search history.

(56) References Cited

FOREIGN PATENT DOCUMENTS

| | | |
|---|---|---|
| JP | 2013254748 A | 12/2013 |
| WO | 2004077886 A1 | 9/2004 |
| WO | 2013073169 A1 | 5/2013 |

OTHER PUBLICATIONS

Y. Li, et al; High general and special color rendering index white organic light-emitting device with . . . ; Organic Electronics; vol. 14; No. 8; Aug. 2013.

International Search Report dated Apr. 7, 2015 for PCT/JP2015/055902 and English translation.

\* cited by examiner

ORGANIC ELECTROLUMINESCENT ELEMENT AND ELECTRONIC DEVICE

CROSS REFERENCE TO RELATED APPLICATION

This Application is a 371 of PCT/JP2015/055902 filed on Feb. 27, 2015 which, in turn, claimed the priority of Japanese Patent Application No. 2014-076799 filed on Apr. 3, 2014, both applications are incorporated herein by reference.

TECHNICAL FIELD

The present invention relates to an organic electroluminescent element, and to an electronic device including the organic electroluminescent element.

BACKGROUND ART

An organic electroluminescent element (hereinafter, also referred to as an organic EL element) has a configuration in which a light-emitting layer containing a light-emitting compound is sandwiched between an anode and a cathode. Furthermore, the organic electroluminescent element is a light-emitting element that generates an exciton by recombining a positive hole injected from an anode and an electron injected from a cathode in the light-emitting layer through application of an electric field, and that utilizes emission of light (fluorescence/phosphorescence) when the exciton is deactivated. The organic EL element is a complete solid state component in which a gap between electrodes is constituted of a film of an organic material having only an approximate submicron thickness, and can emit light with a voltage of approximately several volts to several tens of volts. Accordingly, the utilization for next-generation flat displays and flat lighting devices is expected.

There is proposed, as the organic EL element, for example, an element having a configuration in which two light-emitting layers in a complementary color relation to each other are laminated so as to make contact with each other to thereby achieve white light emission, namely, a so-called two-wavelength-type white light-emitting element. However, such two-wavelength-type white light-emitting element can give good white on the CIE chromaticity coordinate, but the emission spectrum thereof is not continuous and has only two peaks in a complementary color relation to each other. Accordingly, it is difficult to obtain broad white light close to natural light.

On the other hand, research and development of a white light-emitting element having an emission spectrum including each peak in respective wavelength regions of red, green and blue, namely, a so-called three-wavelength-type white light-emitting element, instead of the two-wavelength-type white light-emitting element, is also being advanced (see, for example, Patent Literature 1, Patent Literature 2).

As to three-wavelength-type white light-emitting elements described in Patent Literature 1 or Patent Literature 2, it is described that a high current efficiency (luminance obtained relative to a certain current density) can be obtained by laminating a plurality of light-emitting elements in series and superposing light emission from each of light-emitting elements. Furthermore, it is described that a white light-emitting element can be obtained by laminating light-emitting elements having different light emission colors in series.

CITATION LIST

Patent Literature

PTL 1: Japanese Patent Laid-Open No. 2006-12793
PTL 2: Japanese Patent Laid-Open No. 2013-254748

SUMMARY OF INVENTION

Technical Problem

However, the three-wavelength-type white light-emitting elements described in Patent literature 1 or Patent literature 2 are configured with the aim of enhancing a mean color-rendering index (Ra) that is an average value of rendering indices of R1 to R8.

On the other hand, the evaluation of color rendering properties of an organic EL element is required to bring emission light close to natural light. In order to bring emission light close to natural light, there is required enhancement of a special color-rendering index R9 that exhibits red color rendering properties with high color saturation, together with the mean color-rendering index (Ra).

Accordingly, when there is a request for the special color-rendering index R9 that exhibits red color rendering properties with high color saturation together with the mean color-rendering index (Ra), three-wavelength-type white light-emitting elements of the above-described configuration cannot cope with the request.

In order to solve the above-described problem, the present invention provides an organic electroluminescent element capable of enhancing the special color-rendering index R9, and an electronic device having the organic electroluminescent element.

Solution to Problem

The organic electroluminescent element of the present invention has an anode, a cathode, and a light-emitting layer that is sandwiched between the anode and the cathode, and the light-emitting layer contains at least two kinds of light-emitting dopants each of which exhibits an emission spectrum having a peak in a region of a wavelength of 580 nm or more.

Furthermore, the electronic device of the present invention has the above-described organic electroluminescent element.

According to the organic electroluminescent element of the present invention, the emitted light of the organic electroluminescent element has a broad emission spectrum distribution in a region of a wavelength of 580 nm or more, by using at least two kinds of dopants each of which exhibits an emission spectrum having a peak in a region of a wavelength of 580 nm or more. The special color-rendering index R9 can be enhanced by imparting a broad emission spectrum in a region of a wavelength of 580 nm or more to emission light of the organic electroluminescent element, as described above.

Advantageous Effects of Invention

According to the present invention, an organic electroluminescent element excellent in the special color-rendering index R9, and an electronic device having the organic electroluminescent element are provided.

DESCRIPTION OF EMBODIMENTS

Hereinafter, examples of forms for practicing the present invention will be explained, but the present invention is not limited to examples below.

Note that the explanation will be carried out in the order as indicated below.

1. An embodiment of an organic electroluminescent element (a first embodiment)
2. An embodiment of an organic electroluminescent element (a second embodiment)
3. An embodiment of an electronic device (a third embodiment)

1. An Embodiment of an Organic Electroluminescent Element (the First Embodiment)

Figure 1:
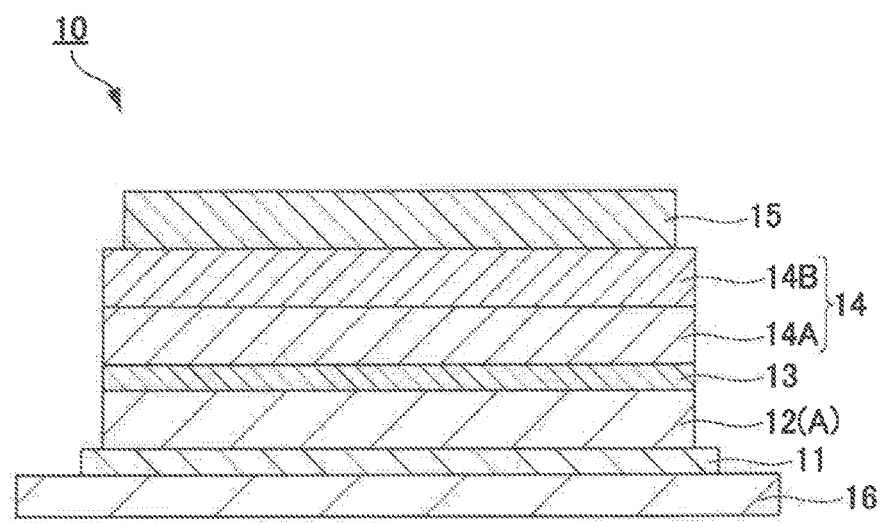
FIG. 1 is a drawing showing a schematic configuration of an organic EL element of a first embodiment.

Hereinafter, a specific embodiment of the organic electroluminescent element (organic EL element) of the present invention will be explained. In FIG. 1, the configuration of the organic EL element of the present embodiment is shown.

[Configuration of Organic EL Element]

An organic EL element 10 shown in FIG. 1 includes an anode 11, a first light-emitting unit 12, an intermediate connector layer 13, a second light-emitting unit 14, and a cathode 15. In addition, each of these layers is laminated and formed on a substrate 16. Details of each of these configurations will be described later.

In the organic EL element 10, the anode 11 is formed on the substrate 16, and the first light-emitting unit 12 is formed on the anode 11. Furthermore, the intermediate connector layer 13 is formed on the first light-emitting unit 12, and the second light-emitting unit 14 is formed on the intermediate connector layer 13. Moreover, the cathode 15 is formed on the second light-emitting unit 14.

The organic EL element 10 has a so-called bottom emission type configuration in which the anode 11 is constituted of a transparent electrode, the cathode 15 has a function as a reflection electrode, and light is extracted from the substrate 16 side.

Furthermore, the organic EL element 10 has a so-called tandem type configuration in which the first light-emitting unit 12 and the second light-emitting unit 14 are laminated via the intermediate connector layer 13.

The first light-emitting unit 12 and the second light-emitting unit 14 have at least one or more light-emitting layers containing a light-emitting organic material. In addition, the organic EL element 10 is an example of a so-called four-wavelength-type white light-emitting element having each of light-emitting dopants of respective colors of blue (B), green (G) and red (R) in these light-emitting layers, as the light-emitting organic material.

In the organic EL element 10 shown in FIG. 1, a first light-emitting layer 12A is exemplified as the first light-emitting unit 12. Furthermore, FIG. 1 exemplifies a second light-emitting layer 14A and a third light-emitting layer 14B as the second light-emitting unit 14. Note that, although not described in FIG. 1, the first light-emitting unit 12 and the second light-emitting unit 14 may contain a layer other than these light-emitting layers.

[Emission Spectrum]

The first light-emitting layer 12A included in the first light-emitting unit 12 has a first red light-emitting dopant and a green light-emitting dopant as light-emitting dopants. In addition, the second light-emitting layer 14A included in the second light-emitting unit 14 has a second red light-emitting dopant and the green light-emitting dopant. Furthermore, the third light-emitting layer 14B included in the second light-emitting unit 14 has a blue light-emitting dopant.

The first red light-emitting dopant and the second red light-emitting dopant are dopants of different kinds, and both have a peak in a region of a wavelength of 580 nm or more in respective emission spectra. Moreover, the peak of the first red light-emitting dopant and the peak of the second red light-emitting dopant in respective emission spectra are preferably different. Note that the emission spectrum referred to herein means an emission spectrum when an element that uses singly each of light-emitting dopants is made to emit light.

The use of different kinds of dopants as the first red light-emitting dopant and the second red light-emitting dopant makes it possible to obtain two different kinds of emission spectrum distributions each having a peak at a wavelength of 580 nm or more. In this way, a broad distribution can be given to the emission spectrum of the organic EL element 10 in a region of a wavelength of 580 nm or more, by using two kinds of dopants each having an emission spectrum which has a peak at a wavelength of 580 nm or more and which is different from each other, as described above. Furthermore, the special color-rendering index R9 which denotes red color rendering properties with high color saturation of the organic EL element 10 can be enhanced by making the emission spectrum have a broad distribution in a region of a wavelength of 580 nm or more.

Figure 2:
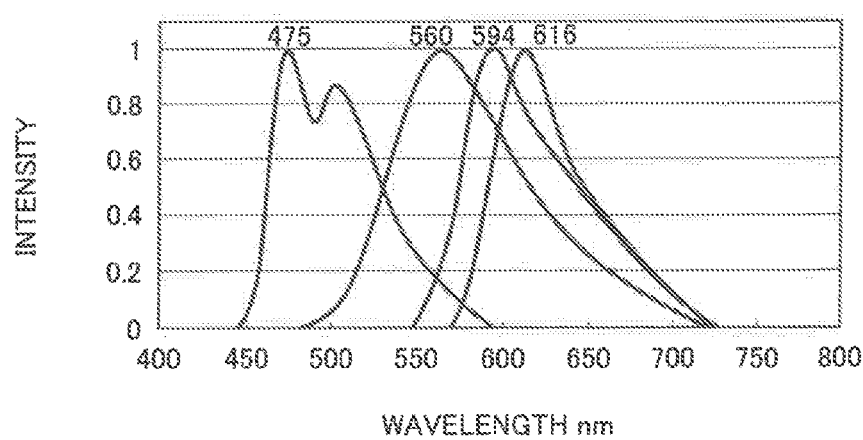
FIG. 2 is a drawing showing an emission spectrum of the organic EL element of the first embodiment.

FIG. 2 shows an example of the emission spectrum of the organic EL element 10 having the above-described configuration. Note that the emission spectrum shown in FIG. 2 is an emission spectrum when an element that uses singly each of light-emitting dopants emits light. The total emission spectrum of light from the organic EL element 10 is brought into a state where the emission spectrum of each of light-emitting dopants is integrated.

The emission spectra shown in FIG. 2 show an example in which there are used a dopant having a peak at a wavelength of 616 nm as the first red light-emitting dopant and a dopant having a peak at a wavelength of 560 nm as a green light-emitting dopant, as dopants contained in the first light-emitting layer 12A. In addition, the emission spectra show an example in which there are used a dopant having a peak at wavelength of 594 nm as the second red light-emitting dopant and the dopant having a peak at a wavelength of 560 nm as is the case for the first light-emitting layer 12A as a green light-emitting dopant, as dopants contained in the second light-emitting layer 14A. Furthermore, the emission spectra show an example in which a dopant having a peak at a wavelength of 475 nm is used as a blue light-emitting dopant contained in the third light-emitting layer 14B.

As shown in FIG. 2, the emission spectrum of each of light-emitting dopants of three colors of red, green and blue broadens in a prescribed range with an individual peak, and thus a configuration in which white light is extracted from the organic EL element 10 is given.

The organic EL element 10 has a configuration in which the emission spectrum of the first red light-emitting dopant and the emission spectrum of the second red light-emitting dopant are superposed, in particular, in a region of a wavelength of 580 nm or more that is important for enhancing the special color-rendering index R9.

As a result of having a superimposed emission spectrum from the first red light-emitting dopant and from the second red light-emitting dopant, there is obtained a configuration having abroad spectrum distribution in a region of a wavelength of 580 nm or more that is important for enhancing red color rendering properties. Accordingly, red color rendering properties can be enhanced. Therefore, the special color-rendering index R9 of the organic EL element 10 can be enhanced.

Furthermore, even when the organic EL element 10 has the first red light-emitting dopant and the second red light-emitting dopant, as shown in FIG. 2, there is almost no influence on each of emission spectra of light-emitting dopants of green and blue. Accordingly, no influence is exerted on the chromaticity of white light from the organic EL element 10, and for example, no influence is exerted on the mean color-rendering index Ra.

Therefore, in the organic EL element 10, the special color-rendering index R9 exhibiting red color rendering properties with high color saturation can be enhanced without deteriorating the mean color-rendering index Ra.

Furthermore, the organic EL element 10 has four kinds of light-emitting dopants, that is, two kinds of light-emitting dopants (the first red light-emitting dopant, the second red light-emitting dopant) each having a peak at a wavelength of 580 nm or more, a blue light-emitting dopant and a green light-emitting dopant.

As a result of having four kinds or more of light-emitting dopants as described above, a wavelength region in which emission spectra of respective light-emitting dopants are superimposed is extended as compared with that of an organic EL element, for example, having two kinds or three kinds of light-emitting dopants. Thereby, a broad emission spectrum distribution can be imparted to the organic EL element 10 in the whole wavelength region.

In addition, as a result of the fact that a wavelength region in which respective emission spectra of light-emitting dopants are superimposed becomes larger, a ratio of a spectrum of one light-emitting dopant to the whole emission spectrum of the organic EL element 10 becomes smaller. Accordingly, even when the emission luminance of one light-emitting dopant changes by degradation with passage of time or by a current density, the emission luminance may be compensated by light emission of another light-emitting dopant, and influence on the whole emission spectrum of the organic EL element 10 becomes smaller.

Therefore, a white light-emitting element whose chromaticity of white color does not easily change with passage of time can be constituted. Furthermore, a white light-emitting element whose shape of the emission spectrum does not easily depend on a current density can be constituted.

[Carrier Transport Properties]

Moreover, in the organic EL element 10 shown in FIG. 1, a green light-emitting dopant is contained in the first light-emitting layer 12A, together with the first red light-emitting dopant. Furthermore, a green light-emitting dopant is contained in the second light-emitting layer 14A, together with the second red light-emitting dopant.

As described above, in a light-emitting layer containing a red light-emitting dopant having a peak at a wavelength of 580 nm or more, another light-emitting dopant having a peak at a wavelength of less than 580 nm is preferably contained together with a red light-emitting dopant.

A red light-emitting dopant tends to exhibit low carrier transport properties. Accordingly, in a light-emitting layer containing a red light-emitting dopant, a drive voltage tends to increase by lowering of carrier transport properties. When the first red light-emitting dopant and the second red light-emitting dopant having low carrier transport properties as described above are contained in the same light-emitting layer, the total carrier transport properties of the light-emitting layer are easily lowered and the drive voltage of the organic EL element is easily increased. Accordingly, the first red light-emitting dopant and the second red light-emitting dopant are preferably included in different light-emitting layers.

On the other hand, a blue light-emitting dopant and a green light-emitting dopant tend to exhibit higher carrier transport properties than a red light-emitting dopant. In particular, a green light-emitting dopant tends to exhibit high carrier transport properties. Accordingly, in a light-emitting layer containing a blue light-emitting dopant or a green light-emitting dopant, increase in a drive voltage is not easily generated.

Therefore, a light-emitting layer containing a red light-emitting dopant that exhibits low carrier transport properties preferably includes a blue light-emitting dopant or a green light-emitting dopant together with the red light-emitting dopant. A blue light-emitting dopant or a green light-emitting dopant is contained together with a red light-emitting dopant in the same light-emitting layer, and thus carrier transport properties of the red light-emitting dopant can be compensated by high carrier transport properties of the blue light-emitting dopant or the green light-emitting dopant. That is, the lowering of carrier transport properties in the light-emitting layer caused by a red light-emitting dopant can be suppressed, and the increase in the drive voltage of the organic EL element can be suppressed.

In particular, the drive voltage of the organic EL element can be lowered by adding a green light-emitting dopant together with a red light-emitting dopant to a light-emitting layer. It is considered that this is because a red light-emitting dopant and a green light-emitting dopant have a HOMO level and a LUMO level which are close to each other, and thereby a trap level is not easily generated and carrier transport is carried out at both of the levels. Accordingly, low voltage drive of the organic EL element becomes possible by including a red light-emitting dopant and a green light-emitting dopant in the same light-emitting layer.

As described above, in the organic EL element 10, the first red light-emitting dopant and the second red light-emitting dopant each having low carrier transport properties are separated and arranged in the first light-emitting layer 12A and the second light-emitting layer 14A, respectively. Furthermore, it is possible to suppress the lowering of carrier transport properties in the first light-emitting layer 12A and suppress the increase in the drive voltage, by collectively including the first red light-emitting dopant having low carrier transport properties and the green light-emitting dopant having high carrier transport properties in the first light-emitting layer 12A. In the same way, it is possible to suppress the lowering of carrier transport properties in the second light-emitting layer 14A and suppress the increase in the drive voltage, by collectively including the second red light-emitting dopant having low carrier transport properties and the green light-emitting dopant having high carrier transport properties in the second light-emitting layer 14A.

[Plasmon Mode]

Furthermore, in the case of two light-emitting dopants each having a peak at a wavelength of 580 nm or more, a light-emitting dopant on the short wavelength side is preferably contained in a light-emitting layer close to the cathode 15.

In the organic EL element 10 shown in FIG. 1, the first red light-emitting dopant having a peak at a wavelength of 616 nm is contained in the first light-emitting layer 12A of the first light-emitting unit 12, and the second red light-emitting dopant having a peak at a wavelength of 594 nm is contained in the second light-emitting layer 14A of the second light-emitting unit 14. Accordingly, the second red light-emitting dopant having a peak on the short wavelength side is contained in the second light-emitting layer 14A on the side closer to the cathode 15.

The organic EL element 10 is of a bottom emission type having a configuration in which the anode 11 is a transparent electrode and the cathode 15 serves as a reflection electrode.

Light entering the cathode 15 serving as a reflection electrode, of light having been generated in each of light-emitting layers of the organic EL element 10, acts on free electrons in the cathode 15 to thereby generate a plasmon mode being a kind of a waveguide mode, and is trapped near the surface of the cathode 15. The loss of light is referred to as a plasmon loss, and is generally said to be the loss of approximately 30 to 40%.

In the organic EL element 10, it becomes indispensable to reduce the plasmon loss in order to achieve power efficiency and an emission lifetime.

The plasmon loss is dependent on an emission wavelength, and a longer wavelength easily gives a larger plasmon loss. Furthermore, a smaller distance between the light-emitting layer and the reflection electrode gives a larger influence of the plasmon mode, and the plasmon mode easily decreases as the light-emitting layer is away from the reflection electrode. Accordingly, the plasmon loss in the organic EL element 10 can be suppressed by incorporating a light-emitting dopant having a peak in a short wavelength region in the light-emitting layer formed on the reflection electrode side, and by incorporating a light-emitting dopant having a peak in a long wavelength region in the light-emitting layer located in a position farther from the reflection electrode.

In the organic EL element 10, a reflection electrode made from metal is set as the cathode 15, and, therefore, preferably the second red light-emitting dopant having a peak on a shorter wavelength side is incorporated in the second light-emitting layer 14A of the second light-emitting unit 14 lying on the side nearer to the cathode 15. Further, preferably the first red light-emitting dopant having a peak on a longer wavelength side is incorporated in the first light-emitting layer 12A lying on the side nearer to the anode 11. As a result of adopting such a configuration, the improvement of emission efficiency of the organic EL element 10 is made possible.

Note that, in the case where the anode 11 and the cathode 15 are lain reversely, dopants to be incorporated in respective light-emitting layers are also reversed. That is, the plasmon loss can be suppressed by incorporating a light-emitting dopant having a peak in a shorter wavelength region in a light-emitting layer lying nearer to an electrode by which light is reflected, and incorporating a light-emitting dopant having a peak in a longer wavelength region in the light-emitting layer lying farther from an electrode by which light is reflected.

[Details of Configuration]

Hereinafter, details of respective configurations of the anode 11, the first light-emitting unit 12, the intermediate connector layer 13, the second light-emitting unit 14 and the cathode 15 of the organic EL element 10 shown in FIG. 1, and details of a configuration of the substrate 16 on which the organic EL element 10 is provided will be explained. Note that each of configurations of the organic EL element to be explained below is an example for explaining the embodiment, and another configuration can also be suitably applied in a range in which the above-described organic EL element can be constituted.

[Anode]

An electrode substance composed of a metal, an alloy, an electroconductive compound, or a mixture thereof having a large work function (4 eV or more, preferably 4.3 V or more) is used as the anode 11 in the organic EL element 10. Specific examples of these electrode substances include metals such as Au and Ag and alloys thereof, and electroconductive transparent materials such as CuI, indium-tin-oxide (ITO), $SnO_2$ and ZnO. In addition, there may also be used a material from which an amorphous and transparent electroconductive film such as IDIXO ($In_2O_3$—ZnO) can be produced.

When emitted light is to be extracted from the anode 11 side, the transmittance is desirably made larger than 10%. In addition, sheet resistance as the anode is preferably several hundred Ω/sq. or less. Furthermore, the thickness of the anode is selected from a range of usually 10 nm to 1 μm, preferably 10 nm to 200 nm, although the thickness depends on the material.

[Light-Emitting Unit]

The first light-emitting unit 12 includes at least one or more light-emitting layers which are provided between the anode 11 and the intermediate connector layer 13, and which contain an organic material having light emission properties. Furthermore, the second light-emitting unit 14 includes one or more light-emitting layers which are provided between the intermediate connector layer 13 and the cathode 15, and which contain an organic material having light emission properties. Note that the first light-emitting unit 12 and the second light-emitting unit 14 may include another layer between the light-emitting layer, and the anode 11, the intermediate connector layer 13 or the cathode 15.

Hereinafter, these first light-emitting unit 12 and second light-emitting unit 14 will be collectively described as a light-emitting unit and explained. Furthermore, first to third light-emitting layers formed in the first light-emitting unit 12 and the second light-emitting unit 14 will also be collectively described as a light-emitting layer and explained.

Representative element configurations of the light-emitting unit can include configurations below, but are not limited to these.

(1) hole injection transport layer/light-emitting layer/electron injection transport layer (2) hole injection transport layer/first light-emitting layer/second light-emitting layer/electron injection transport layer (3) hole injection transport layer/first light-emitting layer/intermediate connector layer/second light-emitting layer/electron injection transport layer (4) hole injection transport layer/light-emitting layer/positive hole-blocking layer/electron injection transport layer (5) hole injection transport layer/electron-blocking layer/light-emitting layer/positive hole-blocking layer/electron injection transport layer (6) positive hole-injecting layer/positive hole transport layer/light-emitting layer/electron transport layer/electron-injecting layer (7) positive hole-injecting layer/positive hole transport layer/light-emitting layer/positive hole-blocking layer/electron transport layer/electron-injecting layer (8) positive hole-injecting layer/positive hole transport layer/electron-blocking layer/light-emitting layer/positive hole-blocking layer/electron transport layer/electron-injecting layer In the configuration, the light-emitting layer is constituted of a single layer or a plurality of layers.

The electron transport layer is a layer having a function of transporting electrons. The electron transport layer includes the electron-injecting layer and the positive hole-blocking layer, in a broad sense. The electron transport layer may be constituted of a plurality of layers.

The positive hole transport layer is a layer having a function of transporting positive holes. The positive hole transport layer includes the positive hole-injecting layer and the electron-blocking layer, in a broad sense. Furthermore, the positive hole transport layer may be constituted of a plurality of layers.

The formation method of each of layers can be carried out by forming a film through the use of, for example, a known thin film forming method such as a vacuum vapor deposition method, spin-coating method, a cast method, an LB method (Langmuir-Blodgett method), an ink-jet method, a spray method, a printing method and a slot-type coater method.

A phosphorescent material and a fluorescent material may be mixed in the light-emitting layer within the light-emitting unit, but a configuration on the basis of a phosphorescent material alone or a configuration on the basis of a fluorescent material alone is preferable. A fluorescent light-emitting layer and a phosphorescent light-emitting layer are preferably host/dopant-type light-emitting layers. In addition, a light-emitting dopant contained in the light-emitting layer may be contained in a uniform concentration in the thickness direction of the light-emitting layer, or may have a concentration distribution.

When the organic EL element is provided with a plurality of light-emitting units, light-emitting units having different configurations may be combined and used, and light-emitting units have preferably configurations of using the same layer and material excluding a light-emitting layer. Furthermore, each of light-emitting units preferably has the same number of light-emitting layers. Accordingly, the number of materials to be used can be reduced and thus there are advantages in manufacturing from the viewpoint of cost, quality control, and the like. Furthermore, in a vapor deposition process, there is an advantage in manufacturing efficiency that a film forming chamber is easily made common for respective light-emitting units.

For the above-described reason, in a case where white light-emitting units are to be laminated, configurations and materials of all layers including the light-emitting layer are preferably the same.

In addition, when white light emission is to be obtained by laminating light-emitting units that exhibit different emission colors, these light-emitting units are preferably in a complementary color relation to each other. For example, an organic EL element that exhibits white light emission can be obtained by providing a blue light-emitting unit and a light-emitting unit that exhibits emission color of greenish-yellow, yellow or orange that is the complementary color. Note that the relationship of "complementary colors" means the relationship of colors, mixing of which results in achromatic color. Namely, white light emission can be obtained by mixing light emissions of substances that emit lights in a complementary color relation to each other.

Since white light emission with high color rendering properties is obtained and adjustment of chromaticity is easy in a broader range, a layer that emits green and red light emission colors is preferably provided in any of light-emitting units in addition to a blue light-emitting layer. Furthermore, a light-emitting layer that exhibits white light emission, by mixing blue, green and red light-emitting materials in one light-emitting layer, can be provided in a light-emitting unit.

Figure 4:
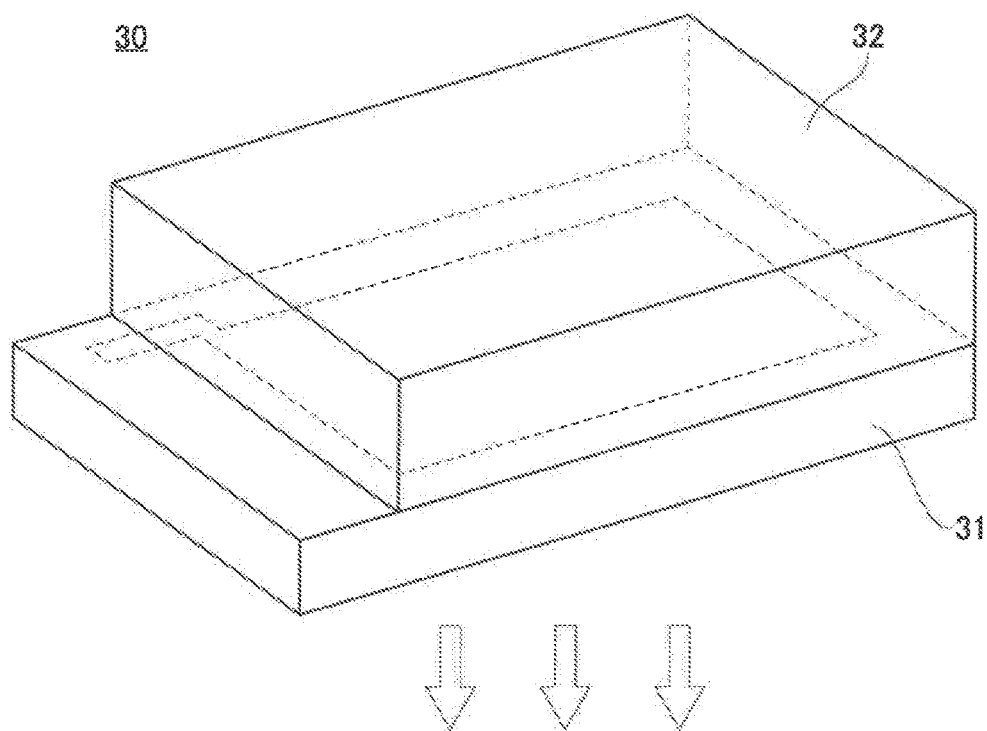
FIG. 4 is a drawing showing a schematic configuration of an organic EL element that was produced in Example.

Light emission colors of an organic EL element and a compound are determined by applying a result measured with a spectral radiance luminance meter CS-2000 (manufactured by Konica Minolta Sensing) to the CIE chromaticity coordinate in FIG. 4.16, page 108, "New Edition Color Science Handbook," (edited by Color Science Association of Japan, University of Tokyo Press, 1985).

Light is referred to as white light when the deviation Duv of the color of the light from the trajectory of blackbody radiation is included in a range of −20 to +20 in the range of 2500 to 7500K of correlated color temperature. The definition of Duv (=1000 duv) is on the basis of JIS Z 8725: 1999, "Methods for determining distribution temperature and color temperature or correlated color temperature of light sources."

The thickness of each of layers included in respective light-emitting units is not particularly limited. The thickness is adjusted preferably in a range of 5 to 200 nm, more preferably in a range of 10 to not more than 100 nm, from the viewpoint of homogeneity of a film to be formed, preventing application of an unnecessary high voltage at the time of light emission, and enhancing stability of the color of emitting light relative to a drive current.

Hereinafter, respective layers constituting the light-emitting unit will be explained.

[Light-Emitting Layer]

The light-emitting layer is a layer that contains a light-emitting organic semiconductor thin film, and that provides a field where an electron and a positive hole which are injected from an electrode or an adjacent layer recombine to thereby emit light via an exciton. The light-emitting layer preferably contains a light-emitting dopant (also referred to as a light-emitting dopant compound, a dopant compound, or simply a dopant), and a host compound (also referred to as a matrix material, a light-emitting host compound, or simply a host).

A method for forming the light-emitting layer is not particularly limited, and the layer can be formed by a conventionally known method such as a vacuum vapor deposition method, a wet process or the like. From the viewpoint of manufacturing cost of an organic EL element, the layer is preferably formed by a wet process.

(1. Light-Emitting Dopant)

The light-emitting dopant to be preferably used includes a fluorescent light-emitting dopant (also referred to as a fluorescent dopant, or a fluorescent compound), and a phosphorescent light-emitting dopant (also referred to as a phosphorescent dopant, or a phosphorescent compound). Concentration of the light-emitting dopant in the light-emitting layer can be arbitrarily determined on the basis of necessary conditions of a specific dopant and a device to be used. The concentration of the light-emitting dopant may be uniform in the thickness direction of the light-emitting layer, or may have an arbitrary distribution.

Furthermore, the light-emitting layer may contain plural kinds of light-emitting dopants. For example, a combination of dopants having different structures, or a combination of a fluorescent light-emitting dopant and a phosphorescent light-emitting dopant may be used. Thereby, an arbitrary light emission color can be obtained.

In the organic EL element, one or a plurality of light-emitting layers contain a plurality of light-emitting dopants having different light emission colors and preferably exhibits white light emission. A combination of light-emitting dopants that exhibits white color is not particularly limited, and examples thereof include a combination of blue and orange, a combination of blue, green and red, and the like. White color in the organic EL element preferably has chromaticity in the CIE 1931 color specification system at 1000 cd/m$^2$ within a region of x=0.39±0.09, y=0.38±0.08, when 2-degree viewing angle front luminance is measured by the aforementioned method.

(1-1. Phosphorescent Light-Emitting Dopant)

A phosphorescent light-emitting dopant is a compound from which light emission from an excited triplet is observable. Specifically, the dopant is a compound that emits phosphorescent light at room temperature (25° C.), and is a compound having a phosphorescence quantum yield of 0.01 or more at 25° C. In the case of a phosphorescent light-emitting dopant to be used in the light-emitting layer, a preferable phosphorescence quantum yield is 0.1 or more.

The phosphorescence quantum yield can be measured by the method described in page 398 of Spectral Analysis II of Course of Experimental Chemistry 7, fourth edition (1992, Maruzen). A phosphorescence quantum yield in a solution can be measured using various solvents. In the case of the phosphorescent light-emitting dopant to be used in the light-emitting layer, the phosphorescence quantum yield (0.01 or more) may be achieved in any of arbitrary solvents.

Two principles can be mentioned with respect to the light emission of the phosphorescent light-emitting dopant.

One of them includes the fact that an excited state of a host compound by recombination of carriers is generated on a host compound through which carriers are transported. The one is an energy transfer type in which light emission is obtained from the phosphorescent light-emitting dopant by transferring the energy to a phosphorescent light-emitting dopant. Another one is a carrier trap type in which a phosphorescent light-emitting dopant serves as a carrier trap and recombination of carriers is generated on the phosphorescent light-emitting dopant to thereby give light emission from the phosphorescent light-emitting dopant. Both cases are satisfied under the condition in which the energy of excited state of the phosphorescent light-emitting dopant is lower than the energy of excited state of the host compound.

The phosphorescent light-emitting dopant can be arbitrarily selected and used from known materials that are used for a light-emitting layer of an organic EL element.

Specific examples of known phosphorescent light-emitting dopants include compounds described in the literatures below, and the like.

Examples of phosphorescent light-emitting compounds preferably include compounds shown by general formulae (4), (5) or (6) described in Japanese Patent Laid-Open No. 2013-4245, paragraphs [0185]-[0235].

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), International Publication Nos. 2009100991, 2008101842 and 2003040257, and US Patent Publication Nos. 2006835469, 20060202194, 20070087321 and 20050244673

Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), International Publication Nos. 2009050290, 2002015645 and 2009000673, US Patent Publication No. 20020034656, U.S. Pat. No. 7,332,232, US Patent Publication Nos. 20090108737 and 20090039776, U.S. Pat. Nos. 6,921,915 and 6,687,266, US Patent Publication Nos. 20070190359, 20060008670, 20090165846 and 20080015355, U.S. Pat. Nos. 7,250,226 and 7,396,598, US Patent Publication Nos. 20060263635, 20030138657 and 20030152802, and U.S. Pat. No. 7,090,928

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), International Publication Nos. 2002002714, 2006009024, 2006056418, 2005019373, 2005123873, 2005123873, 2007004380 and 2006082742, US Patent Publication Nos. 20060251923 and 20050260441, U.S. Pat. Nos. 7,393,599, 7,534,505 and 7,445,855, US Patent Publication Nos. 20070190359 and 20080297033, U.S. Pat. No. 7,338,722, US Patent Publication No. 20020134984, U.S. Pat. No. 7,279,704, and US Patent Publication Nos. 2006098120 and 2006103874

International Publication Nos. 2005076380, 2010032663, 2008140115, 2007052431, 2011134013, 2011157339, 2010086089, 2009113646, 2012020327, 2011051404, 2011004639 and 2011073149, US Patent Publication Nos. 2012228583 and 2012212126, and Japanese Patent Laid-Open Nos. 2012-069737, 2012-195554, 2009-114086, 2003-81988, 2002-302671 and 2002-363552

Among them, examples of preferable phosphorescent light-emitting dopants include organic metal complexes having Ir as a central metal. More preferably, complexes including at least one coordination form selected from metal-carbon bond, metal-nitrogen bond, metal-oxygen bond and metal-sulfur bond are preferred.

(1-2. Fluorescent Light-Emitting Dopant)

A fluorescent light-emitting dopant is a compound that can emit light from an excited singlet, and is not particularly limited as far as light emission from an excited singlet is observed.

Examples of fluorescent light-emitting dopants include, for example, anthracene derivatives, pyrene derivatives, chrysene derivatives, fluoranthene derivatives, perylene derivatives, fluorene derivatives, arylacetylene derivatives, styrylarylene derivatives, styrylamine derivatives, arylamine derivatives, boron complexes, coumarin derivatives, pyran derivatives, cyanine derivatives, croconium derivatives, squarium derivatives, oxobenzanthracene derivatives, fluorescein derivatives, rhodamine derivatives, pyrylium derivatives, perylene derivatives, polythiophene derivatives, or rare-earth-based compounds, and the like.

Furthermore, light-emitting dopant utilizing delayed fluorescence, and the like may be used as a fluorescent light-emitting dopant. Specific examples of light-emitting dopants utilizing delayed fluorescence include compounds described in International Publication No. 2011/156793, Japanese Patent Laid-Open Nos. 2011-213643 and 2010-93181, and the like.

(2. Host Compound)

The host compound is a compound serving mainly as injection and transportation of charges in the light-emitting layer, and light emission from the compound itself is substantially not observed in the organic EL element.

The host compound is preferably a compound having a phosphorescence quantum yield in phosphorescence emission of less than 0.1, and more preferably a compound having a phosphorescence quantum yield of less than 0.01, at room temperature (25° C.). In addition, among compounds contained in the light-emitting layer, the mass ratio of the host compound in the layer is preferably 20% or more.

Moreover, the excited state energy of the host compound is preferably higher than the excited state energy of a light-emitting dopant that is contained in the same layer.

Host compounds may be used alone, or in combination of a plurality of kinds. The use of a plurality of kinds of host compounds makes adjustment of charge transfer possible, and makes higher efficiency of an organic EL element possible.

A host compound to be used in the light-emitting layer is not particularly limited, and compounds that are conventionally used in organic EL elements can be used. The host compound may be, for example, a low-molecular-weight compound, a high-molecular-weight compound having a repeating unit, or a compound having a reactive group such as a vinyl group or an epoxy group may be used.

The well-known host compound preferably has high glass transition temperature (Tg) from the viewpoint of preventing a light emission wavelength from becoming longer while having a positive hole transport capability and an electron transport capability, and from the viewpoint of stability of the organic EL element for heat generation at the time of high temperature driving and during driving the element. The host compound preferably has a Tg of 90° C. or more, more preferably of 120° C. or more. Here, the glass transition temperature 0 (Tg) is a value obtained by a method in accordance with JIS-K-7121 through the use of DSC (Differential Scanning Colorimetry).

Specific examples of the well-known host compound to be used in an organic EL element include compounds described in the following literatures and the like, but are not limited to these.

Japanese Patent Application Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837, US Patent Publication Nos. 20030175553, 20060280965, 20050112407, 20090017330, 20090030202 and 20050238919, International Publication Nos. 2001039234, 2009021126, 2008056746, 2004093207, 2005089025, 2007063796, 2007063754, 2004107822, 2005030900, 2006114966, 2009086028, 2009003898 and 2012023947, Japanese Patent Laid-Open Nos. 2008-074939 and 2007-254297, EP 2034538, and the like.

[Electron Transport Layer]

The electron transport layer to be used in the organic EL element is composed of a material having a function of transporting electrons, and has a function of transferring electrons having been injected from a cathode to the light-emitting layer.

Electron transport materials may be used alone, or in combination of a plurality of kinds.

The total thickness of the electron transport layer is not particularly limited, and is generally within a range of 2 nm to 5 μm, more preferably 2 nm to 500 nm, and further more preferably 5 nm to 200 nm.

Furthermore, in the organic EL element, it is known that light directly extracted from the light-emitting layer through an anode and light extracted after being reflected by a cathode that is a counter electrode interfere with each other, when extracting light having been generated in the light-emitting layer.

Accordingly, in the organic EL element, adjustment of the total thickness of the light-emitting unit is preferably carried out by suitably adjusting the total thickness of the electron transport layer in a range of several nm to several μm.

On the other hand, when the thickness of the electron transport layer is made large, a voltage rises easily, and, therefore, when the thickness is large in particular, an electronic mobility in the electron transport layer is preferably $10^{-5}$ cm$^2$/Vs or more.

A material for use in the electron transport layer (hereinafter, referred to as an electron transport material) may have any of electron injecting or transport properties, and positive hole-blocking properties, and any one can be selected and used from conventionally known compounds. For example, examples thereof include nitrogen-containing heteroaromatic derivatives, aromatic hydrocarbon ring derivatives, dibenzofuran derivatives, dibenzothiophene derivatives, silole derivatives etc.

Examples of the nitrogen-containing heteroaromatic derivatives include: carbazole derivatives, azacarbazole derivatives (one or more carbon atoms constituting a carbazole ring are substituted by nitrogen atoms), pyridine derivatives, pyrimidine derivatives, pyrazine derivatives, pyridazine derivatives, triazine derivatives, quinoline derivatives, quinoxaline derivatives, phenanthroline derivatives, azatriphenylene derivatives, oxazole derivatives, thiazole derivatives, oxadiazole derivatives, thiadiazole derivatives, triazole derivatives, benzimidazole derivatives, benzoxazole derivatives, benzthiazole derivatives, and the like.

Examples of aromatic hydrocarbon ring derivatives include naphthalene derivatives, anthracene derivatives, triphenylene, and the like.

Furthermore, there can also be used, as an electron transport material, metal complexes having a quinolinol skeleton or a dibenzoquinolinol skeleton in a ligand, for example, tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) etc., and metal complexes in which the central metal of these metal complexes are substituted by In, Mg, Cu, Ca, Sn, Ga or Pb.

In addition, a metal-free or metal phthalocyanine, or those in which a terminal thereof is substituted by an alkyl group, a sulfonic acid group or the like can also be preferably used as an electron transport material. Furthermore, distyrylpyrazine derivatives being exemplified as a material of the light-emitting layer can also be used as an electron transport material, and an inorganic semiconductor such as n-type-Si and n-type-SiC can also be used as an electron transport material, as is the case for the positive hole-injecting layer and positive hole transport layer.

Moreover, a polymeric material obtained by introducing the material in a polymer chain, or obtained by using the material as the main chain of the polymer can also be used.

In the organic EL element, an electron-rich electron transport layer may be formed by doping a doping material in the electron transport layer as a guest material. Examples of doping materials include metal compounds such as metal complexes and metal halides and other n-type dopants. Specific examples of electron transport layers having such a configuration include those described in Japanese Patent Laid-Open Nos. 04-297076, 10-270172, 2000-196140 and 2001-102175, and the literatures such as J. Appl. Phys., 95, 5773 (2004).

Specific examples of known preferable electron transport materials include compounds as described in the literatures below, and the like, but are not limited to these.

U.S. Pat. Nos. 6,528,187 and 7,230,107, US Patent Publication Nos. 20050025993, 20040036077, 20090115316, 20090101870 and 20090179554, International Publication Nos. 2003060956 and 2008132085, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293, US Patent Publication No. 2009030202, International Publication Nos. 2004080975, 2004063159, 2005085387, 2006067931, 2007086552, 2008114690, 2009069442, 2009066779, 2009054253, 2011086935, 2010150593 and 2010047707, EP 2311826, Japanese Patent Laid-Open Nos. 2010-251675, 2009-209133, 2009-124114, 2008-277810, 2006-156445, 2005-340122, 2003-45662, 2003-31367 and 2003-282270, International Publication No. 2012115034, and the like.

Examples of more preferable electron transport materials include a pyridine derivative, a pyrimidine derivative, a pyrazine derivative, a triazine derivative, a dibenzofuran derivative, a dibenzothiophene derivative, a carbazole derivative, an azacarbazole derivative and a benzimidazole derivative.

[Positive Hole-Blocking Layer]

The positive hole-blocking layer is a layer having a function of the electron transport layer in a broad sense. Preferably, the layer is formed of a material having a small capability of transporting positive holes while having a function of transporting electrons. The positive hole-blocking layer can enhance recombination probability of an electron and a positive hole, by blocking positive holes while transporting electrons.

Furthermore, the configuration of the electron transport layer as described above can be used as that of the positive hole-blocking layer, as necessary.

The positive hole-blocking layer to be provided in the organic EL element is preferably provided adjacent to the cathode side of the light-emitting layer.

In the organic EL element, the thickness of the positive hole-blocking layer is preferably in a range of 3 to 100 nm, more preferably in a range of 5 to 30 nm.

A material to be used in the above-described electron transport layer is preferably used as a material to be used in the positive hole-blocking layer, and a material to be used as the above-described host compound is also used in the positive hole-blocking layer.

[Electron-Injecting Layer]

The electron-injecting layer (also referred to as a "cathode buffer layer") is a layer provided between the cathode and the light-emitting layer for lowering a drive voltage or enhancing emission luminance. An example of the electron-injecting layer is described in "Forefront of Organic EL Element and Industrialization Thereof" (published on Nov. 30, 1998, by NTS INC.), second editing, chapter 2, "Electrode Material" (pp 123-166).

In the organic EL element, the electron-injecting layer is provided as necessary, and is provided between the cathode and the light-emitting layer as described above, or between the cathode and the electron transport layer.

The electron-injecting layer is preferably an extremely thin film, and the thickness thereof is preferably in a range of 0.1 nm to 5 nm depending on the material. Furthermore, the layer may be a non-uniform film in which a constituent material intermittently exists.

Details of the electron-injecting layer are also described in Japanese Patent Laid-Open Nos. 06-325871, 09-17574, 10-74586, and the like. Specific examples of materials to be preferably used for the electron-injecting layer include: metals represented by strontium, aluminum, and the like; alkali metal compounds represented by lithium fluoride, sodium fluoride, potassium fluoride, and the like; alkaline earth metal compounds represented by magnesium fluoride, calcium fluoride, and the like; metal oxides represented by aluminum oxide; and metal complexes represented by lithium 8-hydroxylate (Liq) and the like, etc. Furthermore, the above-described electron transport materials can also be used.

Moreover, materials to be used in the electron-injecting layer may be used alone, or in combination of a plurality of kinds.

[Positive Hole Transport Layer]

The positive hole transport layer is composed of a material having a function of transporting positive holes. The positive hole transport layer is a layer having a function of transmitting positive holes having been injected from the anode, to the light-emitting layer.

In the organic EL element, the total thickness of the positive hole transport layer is not particularly limited, but is generally in a range of 5 nm to 5 μm, more preferably 2 nm to 500 nm, and further more preferably 5 nm to 200 nm.

A material to be used in the positive hole transport layer (hereinafter, referred to as a positive hole transport material) may have any of positive hole-injecting or transport properties, and electron-blocking properties. The positive hole transport material can be used by selection of arbitrary one from among conventionally known compounds. Positive hole transport materials may be used alone, or in combination of a plurality of kinds.

Examples of positive hole transport materials include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene-based derivatives such as anthracene and naphthalene, fluorene derivatives, fluorenone derivatives, polyvinyl carbazole, polymeric materials or oligomers having an aromatic amine being introduced in the main chain or a side chain, polysilane, and electroconductive polymers or oligomers (such as PEDOT:PSS, aniline-based copolymer, polyaniline, polythiophene), and the like.

Examples of triarylamine derivatives include compounds of a benzidine type represented by α-NPD, compounds of a starburst type represented by MTDATA, compounds having fluorene or anthracene at a triarylamine connection core part, and the like.

In addition, hexaazatriphenylene derivatives as described in Japanese Unexamined Patent Application Publication No.

2003-519432, Japanese Patent Laid-Open No. 2006-135145, etc. can also be used as a positive hole transport material.

Furthermore, a p-rich positive hole transport layer having been doped with impurities can also be used. For example, configurations described in Japanese Patent Laid-Open Nos. 04-297076, 2000-196140 and 2001-102175, J. Appl. Phys., 95, 5773 (2004), etc. can also be applied to the positive hole transport layer.

In addition, inorganic compounds such as a so-called p-type positive hole transport material, p-type-Si, p-type-SiC, etc. as described in Japanese Patent Laid-Open No. 11-251067, and J. Huang et. al., Applied Physics Letters 80 (2002), p. 139 can also be used. Moreover, ortho-metalated organic metal complexes having Ir or Pt as a central metal represented by Ir(ppy)$_3$ are also preferably used.

The positive hole transport material can use those as described above, and there are preferably used triarylamine derivatives, carbazole derivatives, indolocarbazole derivatives, azatriphenylene derivatives, organic metal complexes, polymeric materials or oligomers having an aromatic amine being introduced in the main chain or a side chain, and the like.

Specific examples of positive hole transport materials include compounds as described in the literatures below, in addition to the literatures as described above, but are not limited to these.

Appl. Phys. Lett. 69, 2160 (1996), J. Lumin. 72-74, 985 (1997), Appl. Phys. Lett. 78, 673 (2001), Appl. Phys. Lett. 90, 183503 (2007), Appl. Phys. Lett. 90, 183503 (2007), Appl. Phys. Lett. 51, 913 (1987), Synth. Met. 87, 171 (1997), Synth. Met. 91, 209 (1997), Synth. Met. 111, 421 (2000), SID Symposium Digest, 37, 923 (2006), J. Mater. Chem. 3, 319 (1993), Adv. Mater. 6, 677 (1994), Chem. Mater. 15, 3148 (2003), US Patent Publication Nos. 20030162053, 20020158242, 20060240279 and 20080220265, U.S. Pat. No. 5,061,569, International Publication Nos. 2007002683 and 2009018009, EP 650955, US Patent Publication Nos. 20080124572, 20070278938, 20080106190 and 20080018221, International Publication No. 2012115034, Japanese Unexamined Patent Application Publication No. 2003-519432, Japanese Patent Laid-Open No. 2006-135145, U.S. patent application Ser. No. 13/585,981

[Electron-Blocking Layer]

The electron-blocking layer is a layer having a function of the positive hole transport layer in a broad sense. Preferably, the layer is formed of a material having a small capability of transporting electrons while having a function of transporting positive holes. The electron-blocking layer can enhance recombination probability of an electron and a positive hole, by blocking electrons while transporting positive holes Furthermore, the configuration of the positive hole transport layer as described above can be used as that of the electron-blocking layer of the organic EL element, as necessary. The electron-blocking layer to be provided in the organic EL element is preferably provided adjacent to the anode side of the light-emitting layer.

The thickness of the electron-blocking layer is in a range of preferably 3 to 100 nm, more preferably 5 to 30 nm.

A material to be used in the above-described positive hole transport layer is preferably used as a material to be used in the electron-blocking layer. In addition, a material to be used as the above-described host compound can be used as the electron-blocking layer.

[Positive Hole-Injecting Layer]

The positive hole-injecting layer (also referred to as an "anode buffer layer") is a layer provided between the anode and the light-emitting layer for lowering a drive voltage or enhancing emission luminance. An example of the positive hole-injecting layer is described in "Forefront of Organic EL Element and Industrialization Thereof" (published on Nov. 30, 1998, by NTS INC.), second editing, chapter 2, "Electrode Material" (pp 123-166).

The positive hole-injecting layer is provided as necessary, and as described above, is provided between the anode and the light-emitting layer, or between the anode and the positive hole transport layer.

Details of the positive hole-injecting layer are described also in Japanese Patent Laid-Open Nos. 09-45479, 09-260062 and 08-288069, and the like.

Examples of materials to be used in the positive hole-injecting layer include materials to be used in the above-described positive hole transport layer, etc. Among them, phthalocyanine derivatives that are represented by copper phthalocyanine, hexaazatriphenylene derivatives as described in Japanese Unexamined Patent Application Publication No. 2003-519432 and Japanese Patent Laid-Open No. 2006-135145, metal oxides that are represented by vanadium oxide, electroconductive polymers such as amorphous carbon, polyaniline (emeraldine) and polythiophene, ortho-metalated complexes that are represented by tris(2-phenylpyridine) iridium complex etc., and triarylamine derivative, etc. are preferable.

A material to be used in the above-described positive hole-injecting layer may be used alone, or in combination of a plurality of kinds.

[Intermediate Connector Layer]

When the light-emitting units are to be laminated, the non-light-emitting intermediate connector layer 13 is preferably provided between respective light-emitting units.

The intermediate connector layer 13 may have a configuration in which a metal single layer is formed in a thickness of approximately 0.1 to 10 nm. Furthermore, the intermediate connector layer 13 may have a configuration of a charge-generating layer that has a function of injecting electrons into the first light-emitting unit 12 and a function of injecting positive holes into the second light-emitting unit 14.

When a metal single layer is used as the intermediate connector layer 13, the generation of the plasmon loss is concerned. Accordingly, there can be preferably used, as the intermediate connector layer 13, the configuration of a charge-generating layer which does not include a metal single layer, and which is obtained by laminating a layer having a function of injecting positive holes and a layer having a function of injecting electrons.

In addition, the intermediate connector layer 13 can be formed using the same material as that of the anode and the cathode. Additionally, the intermediate connector layer 13 can be formed using a material having an electroconductivity lower than that of the anode and cathode.

In the intermediate connector layer 13, for example, insulators or semiconductors such as lithium oxide, lithium fluoride and cesium carbonate can be used as the layer having a function of injecting electrons. Alternatively, a material obtained by adding an electron-donating substance to a material having high electron transport properties can also be used.

There can be used, as materials having high electron transport properties, for example, metal complexes having a quinoline skeleton or a benzoquinoline skeleton such as tris(8-quinolinolate)aluminum (abbreviated name: Alq3), tris(4-methyl-8-quinolinolate)aluminum (abbreviated name: Almq3), bis(10-hydroxybenzo[h]quinolinato)beryllium (abbreviated name: BeBq2), bis(2-methyl-8-quinolinolate) (4-phenylphenolato)aluminum (abbreviated name: BAlq), and the like.

Furthermore, in addition to these, there can be used metal complexes having an oxazole-based or a thiazole-based ligand such as bis[2-(2-hydroxyphenyl)benzoxazolato]zinc (abbreviated name: Zn(BOX)2), bis[2-(2-hydroxyphenyl)benzothiazolato]zinc (abbreviated name: Zn(BTZ)2), and the like.

Moreover, also other than metal complexes, there can be used 2-(4-biphenylyl)-5-(4-tert-butylphenyl)-1,3,4-oxadiazole (abbreviated name: PBD), 1,3-bis[5-(p-tert-butylphenyl)-1,3,4-oxadiazole-2-yl]benzene (abbreviated name: OXD-7), 3-(4-biphenylyl)-4-phenyl-5-(4-tert-butylphenyl)-1,2,4-triazole (abbreviated name: TAZ), bathophenanthroline (abbreviated name: BPhen), bathocuproine (abbreviated name: BCP), and the like.

The above-described substances having high electron transport properties have mainly an electronic mobility of $10^{-6}$ cm$^2$/Vs or more. Note that, when the substances are those having electron transport properties higher than positive hole transport properties, substances other than those described above can also be used.

Addition of an electron-donating substance to a substance having high electron transport properties makes it possible to enhance electron injecting properties. Accordingly, a drive voltage of the light-emitting element can be lowered. There can be used, as electron-donating substances, alkali metal, alkaline-earth metal or rare earth metal, or a metal belonging to Group 13 in periodic table of the elements, oxide thereof or carbonate thereof. Specifically, the use of lithium (Li), cesium (Cs), magnesium (Mg), calcium (Ca), ytterbium (Yb), indium (In), lithium oxide, cesium carbonate, and the like is preferable. Furthermore, an organic compound such as tetrathianaphthacene may also be used as a donating substance.

In addition, there can be used, as a layer having a function of injecting positive holes among the intermediate connector layers 13, for example, semiconductors or insulators such as molybdenum oxide, vanadium oxide, rhenium oxide, and ruthenium oxide. Alternatively, a material obtained by adding an electron-accepting substance to a substance having high positive hole transport properties can be used. Furthermore, a layer composed of an electron-accepting substance may be used.

There can be used, as a substance having high positive hole transport properties, for example, aromatic amine compounds such as 4,4'-bis[N-(1-naphthyl)-N-phenyl-amino]biphenyl (abbreviated name: NPB or α-NPD), N,N'-bis(3-methylphenyl)-N,N'-diphenyl [1,1'-biphenyl]-4,4'-diamine (abbreviated name: TPD), 4,4',4''-tris(N,N-diphenylamino) triphenylamine (abbreviated name: TDATA), and 4,4',4''-tris [N-(3-methylphenyl)-N-phenyl amino]triphenylamine (abbreviated name: MTDATA), and the like.

The above-described substances having high positive hole transport properties are substances mainly having a positive hole mobility of $10^{-6}$ cm$^2$/Vs or more. However, substances other than the above-described substances may be used as long as the substance has positive hole transport properties higher than electron transport properties. Furthermore, the above-described host material may be used.

The positive hole-injecting properties can be enhanced by adding an electron-accepting substance to a substance having high positive hole transport properties. Accordingly, a drive voltage of the light-emitting element can be lowered.

There can be used, as the electron-accepting substance, 7,7,8,8-tetracyano-2,3,5,6-tetrafluoroquinodimethane (abbreviated name: F4-TCNQ), chloranil, and the like. In addition, transition metal oxides can be used. Additionally, oxides of metals belonging to Group 4 to Group 8 in the periodic table of the elements can be used. Specifically, vanadium oxide, niobium oxide, tantalum oxide, chromium oxide, molybdenum oxide, tungsten oxide, manganese oxide and rhenium oxide have high electron-accepting properties and are preferable. Among them, molybdenum oxide is preferable because it is stable even in the atmosphere, has a low hygroscopic property and is easily handled.

Further, rise of a driving voltage can be suppressed even when the thickness of the intermediate connector layer 13 is made thicker by using one or both of a configuration obtained by adding an electron-accepting substance to a substance having high positive hole transport properties, and a configuration obtained by adding an electron-accepting substance to a substance having high electron transport properties. Accordingly, by making the thickness of the intermediate connector layer 13 thicker, short circuit caused by a minute foreign material, impact and the like can be prevented, and a light-emitting element with high reliability can be obtained without the rising of the drive voltage.

Note that, in the intermediate connector layer 13, another layer may be introduced between a layer having a function of injecting positive holes and a layer having a function of injecting electrons, as necessary. For example, an electroconductive layer such as ITO or an electron relay layer may be provided. The electron relay layer has a function of reducing loss of voltage that is generated between the layer having a function of injecting positive holes and the layer having a function of injecting electrons. Specifically, the use of a material whose LUMO level is about −5.0 eV or more is preferable, and the use of a material whose LUMO level is not less than −5.0 eV and not more than −3.0 eV is more preferable. There can be used, for example, 3,4,9,10-perylenetetracarboxydianhydride (abbreviated name: PTCDA), 3,4,9,10-perylenetetracarboxylic-bisbenzimidazole (abbreviated name: PTCBI), and the like.

[Cathode]

An electrode substance that is composed of a metal having a small work function (4 eV or lower) (referred to as a metal of electron injecting properties), an alloy, an electroconductive compound or a mixture thereof is used as the cathode 15. Specific examples of such electrode substances include sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al$_2$O$_3$) mixture, indium, a lithium/aluminum mixture, aluminum, silver, alloys containing silver as a main component, an aluminum/silver mixture, rare earth metal, and the like.

The cathode 15 can be produced by using a method such as vapor deposition or sputtering of the above-described electrode substance. In addition, sheet resistance of the cathode 15 is preferably several hundred Ω/sq. or less. Furthermore, thickness of the cathode 15 is selected generally in a range of 10 nm to 5 μm, preferably 50 nm to 200 nm.

[Substrate]

The kinds of glass, plastic and the like of the substrate 16 to be used in the organic EL element 10 are not particularly limited, and the substrate 16 can include preferably glass, quartz, and a transparent resin film. Particularly preferable is a resin film capable of giving flexibility to the organic EL element 10.

Examples of resin films include films of polyester such as polyethylene terephthalate (PET) and polyethylene naphthalate (PEN), polyethylene, polypropylene, cellophane, cellulose esters such as cellulose diacetate, cellulose triacetate (TAC), cellulose acetate butyrate, cellulose acetate propionate (CAP), cellulose acetate phthalate, cellulose nitrate and derivatives thereof, polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyether imide, polyether ketone imide, polyamide, fluorocarbon resin, nylon, polymethyl methacrylate, acrylic or polyarylates, cycloolefin-based resins such as ARTON (trade name, manufactured by JSR) and APEL (trade name, manufactured by Mitsui Chemicals, Inc.), and the like.

A barrier film made of a film of an inorganic substance or an organic substance, or a hybrid film of these may be formed on the surface of the resin film. The barrier film is preferably a barrier film having a water vapor transmission rate of 0.01 g/(m$^2$·24 hr) or less when measured in accordance with JIS K-7129-1992 (temperature: 25±0.5° C., relative humidity: 90±2% RH). Furthermore, the barrier film is preferably a high barrier film in which an oxygen transmission rate measured in accordance with JIS K 7126-1987 is 10$^{-3}$ ml/(m$^2$·24 hr·atm) or less and a water vapor transmission rate is 10$^{-5}$ g/(m$^2$·24 hr) or less.

It is sufficient that a material for forming the barrier film may be a material having a function of suppressing permeation of substances that cause element deterioration such as moisture and oxygen. For example, silicon oxide, silicon dioxide, silicon nitride and the like can be used. Furthermore, in order to improve brittleness of the barrier film, it is more preferable to impart, to the barrier film, a laminated structure of an inorganic layer and a layer that is composed of an organic material. Although no particular limitation is imposed on the lamination order of the inorganic layer and the organic layer, preferably both are alternately laminated a plurality of times.

A formation method of the barrier film is not particularly limited, and there can be used, for example, a vacuum vapor deposition method, a sputtering method, a reactive sputtering method, a molecular beam epitaxy method, a cluster ion beam method, an ion plating method, a plasma polymerization method, an atmospheric-pressure plasma polymerization method, a plasma CVD method, a laser CVD method, a thermal CVD method, a coating method, and the like. For example, the formation method is preferably based on an atmospheric-pressure plasma polymerization method as described in Japanese Patent Laid-Open No. 2004-68143 is preferable.

[Sealing]

Examples of sealing means to be used for the sealing of the organic EL element 10 include a method of causing a sealing member to adhere to an electrode and a support substrate by using an adhesive.

The sealing member may be arranged so as to cover a display region of the organic EL element, and may have a concave plate shape or a flat pate shape. Furthermore, transparency and electrical insulating properties are not particularly limited.

Specifically, a glass plate, a polymer plate, a polymer film, a metal plate/film and the like are included.

The glass plate can include, in particular, soda-lime glass, barium.strontium-containing glass, lead glass, aluminosilicate glass, borosilicate glass, bariumborosilicate glass, quartz, and the like.

In addition, polymer plates and polymer films can include those made of polycarbonate, acrylic, polyethylene terephthalate, polyether sulfide, polysulfone, and the like.

Metal plates can include those made of metal or alloy containing at least one selected from the group consisting of stainless steel, iron, copper, aluminum, magnesium, nickel, zinc, chromium, titanium, molybdenum, silicon, germanium and tantalum.

A polymer film or a metal film can preferably be used, since the thickness of the organic EL element 10 can be reduced. Furthermore, the polymer film preferably has an oxygen transmission rate of 10$^{-3}$ g/(m$^2$·24 h) or less and a water vapor transmission rate of 10$^{-3}$ g/(m$^2$·24 h) or less. Moreover, both a water vapor transmission rate and an oxygen transmission rate are preferably 10$^{-5}$ g/(m$^2$·24 h) or less.

In order to process a sealing member into a concave shape, sandblast processing, chemical etching processing and the like are used. Specific examples of adhesives can include photocurable or thermosetting adhesives having a reactive vinyl group of acrylic acid-based oligomer or methacrylic acid-based oligomer, moisture-curable adhesives such as 2-cyanoacrylic acid ester, etc. In addition, a thermal and chemical setting type (two-liquid mixing) such as epoxy-based adhesives can be included. Furthermore, hot-melt type polyamide, polyester and polyolefin can be included. Moreover, ultraviolet curable epoxy resin adhesives of a cation-curable type can be included.

Note that an organic EL element may be deteriorated by a heat treatment, and thus adhesion and curing can be preferably carried out from room temperature up to 80° C. In addition, a drying agent may be dispersed in an adhesive. A commercially available dispenser may be used for coating an adhesive to a sealing part, or printing such as screen printing may be carried out.

An inert gas such as nitrogen or argon, or an inactive liquid such as fluorinated hydrocarbon or silicon oil is preferably injected into a gap between the sealing member and the display region of the organic EL element, in a gas phase and liquid phase. In addition, a vacuum state is also possible. Furthermore, a hygroscopic compound may be sealed in its inside.

Examples of hygroscopic compounds include metal oxides (such as sodium oxide, potassium oxide, calcium oxide, barium oxide, magnesium oxide and aluminum oxide), sulfates (such as sodium sulfate, calcium sulfate, magnesium sulfate and cobalt sulfate), metal halides (such as calcium chloride, magnesium chloride, cesium fluoride, tantalum fluoride, cerium bromide, magnesium bromide, barium iodide and magnesium iodide), perchlorates (such as barium perchlorate and magnesium perchlorate), and the like. An anhydrous salt is suitably used in sulfates, metal halides and perchlorates.

(Protection Film, Protection Plate)

A protection film or a protection plate may be provided outside the film for sealing for enhancing mechanical strength of the element. In particular, when the sealing is carried out by the above-described sealing film, the mechanical strength thereof is not always high, and thus such protection film or protection plate is preferably provided. Materials usable for the purpose include a glass plate, a polymer plate/film, a metal plate/film, and the like which are similar to those used for the sealing, and the use of a polymer film is preferable from the viewpoint of weight reduction and film thickness reduction.

[Technique for Enhancing Light Extraction]

Organic EL elements emit light inside a layer having a refractive index (in a range of approximately 1.6 to 2.1) higher than that of the air, and it is generally said that light capable of being extracted is only approximately 15 to 20% of light having been generated in the light-emitting layer. This is because light entering an interface (interface between a transparent substrate and the air) at an angle of θ that is equal to or larger than the critical angle causes total reflection and cannot be extracted to the outside of the element, or the light causes total reflection between the transparent electrode or the light-emitting layer and the transparent substrate, and the light is guided through the transparent electrode or the light-emitting layer, and as the result, the light is scattered in the element side surface direction.

Examples of techniques for enhancing the light extraction efficiency include a method of forming irregularities on the surface of transparent substrate to thereby prevent the total reflection at the interface between the transparent substrate and the air (for example, U.S. Pat. No. 4,774,435 specification), a method for imparting light focusing properties to a substrate to thereby improve the efficiency (for example, Japanese Patent Laid-Open No. 63-314795), a method of forming a reflection surface on a side surface or the like of an element (for example, Japanese Patent Laid-Open No. 01-220394), a method of introducing a flat layer having an intermediate refractive index between a substrate and a light-emitting body to thereby form an antireflection film (for example, Japanese Patent Laid-Open No. 62-172691), a method of introducing a flat layer having a refractive index that is lower than that of a substrate between the substrate and a light-emitting body (for example, Japanese Patent Laid-Open No. 2001-202827), a method of forming a diffraction grating between any of layers of a substrate, a transparent electrode layer and a light-emitting layer (including between the substrate and the outside) (Japanese Patent Laid-Open No. 11-283751), and the like.

[Other Configurations]

Note that, in the above-described first embodiment, there is exemplified a bottom emission type organic EL element, in which the anode serving as a transparent electrode, the first light-emitting unit, the intermediate connector layer, the second light-emitting unit and the cathode serving as a reflection electrode are laminated in the order from the substrate side, but the element is not limited to have the configuration. For example, the lamination order of respective layers may be reversed, or a configuration in which a position of the anode and the cathode is reversed may be acceptable.

In addition, there is explained the case where two kinds of light-emitting dopants each of which exhibits an emission spectrum having a peak at a wavelength of 580 nm or more are used as the light-emitting dopant, but the number of the light-emitting dopants is not limited to this. The number of light-emitting dopants each of which exhibits an emission spectrum having a peak at a wavelength of 580 nm or more may be two or more kinds, and a configuration including three or more kinds is acceptable. In the same way, kinds of the blue light-emitting dopant and the green light-emitting dopant to be used are not particularly limited, and two or more kinds of dopants may be included.

Furthermore, the configuration and lamination number of light-emitting units, and the lamination number of the light-emitting layers are not also particularly limited, and a configuration that can achieve an intended organic EL element can be given. For example, the light-emitting unit that constitutes the organic EL element may be one layer, or a configuration in which three or more light-emitting units are laminated may be adopted. Also in these cases, an effect that is the same as that of the organic EL element of the above-described first embodiment can be obtained by using two or more kinds of light-emitting dopants each of which exhibits an emission spectrum having a peak at a wavelength of 580 nm or more.

2. Embodiment of Organic Electroluminescent Element (Second Embodiment)

Figure 3:
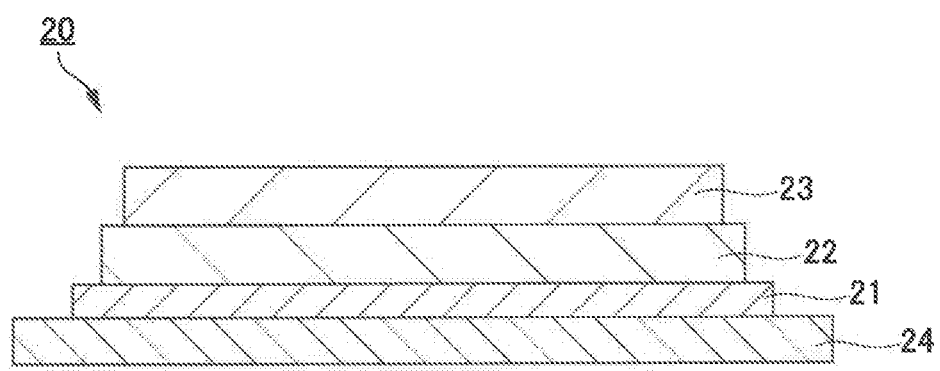
FIG. 3 is a drawing showing a schematic configuration of an organic EL element of a second embodiment.

Next, a second embodiment of the organic electroluminescent element (organic EL element) will be explained. In FIG. 3, the configuration of the organic EL element of the second embodiment is shown.

[Configuration of Organic EL Element]

An organic EL element 20 that is shown in FIG. 3 includes an anode 21, a light-emitting unit 22, and a cathode 23. In addition, each of these layers is laminated and formed on a substrate 24.

In the organic EL element 20, the anode 21 is formed on the substrate 24, and the light-emitting unit 22 is formed on the anode 21. Furthermore, the cathode 23 is formed on the light-emitting unit 22.

The organic EL element 20 has a so-called bottom emission type configuration in which the anode 21 is constituted of a transparent electrode and the cathode 23 is made to function as a reflection electrode and light is extracted from the substrate 24 side.

Furthermore, the organic EL element 20 has at least one or more light-emitting layers that contain a light-emitting organic material, in the light-emitting unit 22. In addition, the organic EL element 20 is an example of a so-called four-wavelength-type white light-emitting element having light-emitting dopants of respective colors of blue (B), green (G) and red (R) in these light-emitting layers as light-emitting organic materials.

Moreover, the light-emitting unit 22 has, in the light-emitting layer, a first red light-emitting dopant and a second red light-emitting dopant each of which exhibits an emission spectrum having a peak at a wavelength of 580 nm or more, and a green light-emitting dopant and a blue light-emitting dopant.

Therefore, the organic EL element of the second embodiment shown in FIG. 3 is different, only in terms of the number of light-emitting units and not having an intermediate connector layer, from the organic EL element of the above-described first embodiment. Namely, only the lamination configuration of the light-emitting unit 22 that is sandwiched between the anode 21 and the cathode 23 is different from the configuration of the organic EL element of the above-described first embodiment. Furthermore, the same configuration as that in the organic EL element of the above-described first embodiment can be applied to respective configurations other than the configuration of the light-emitting unit 22.

In addition, the same configuration as that of the light-emitting unit (first light-emitting unit, second light-emitting unit) that has been explained in the above-described first embodiment can be applied also to the configuration of the light-emitting unit 22. The light-emitting layer that is included in the light-emitting unit 22 may be a single layer, or may be divided into a plurality of layers. The light-emitting layer may be constituted so as to contain only one kind of a light-emitting dopant, or configured so as to contain two kinds or more of light-emitting dopants. Moreover, in the light-emitting unit 22, light-emitting layers that contain each of the first red light-emitting dopant, the second red light-emitting dopant, the green light-emitting dopant and the blue light-emitting dopant are not particularly limited.

As described above, the same configuration as that of the above-described first embodiment can be applied to respective configurations of the organic EL element of the second embodiment, excluding the difference in the number of light-emitting units. Therefore, detailed explanation of respective configurations of the organic EL element of the second embodiment is omitted.

As described above, also in the second embodiment, an emission spectrum having a broad distribution can be given in a region of a wavelength of 580 nm or more in the organic EL element 20, by containing two kinds of red light-emitting dopants each of which exhibits an emission spectrum having a peak at a wavelength of 580 nm or more in the light-emitting unit 22. In addition, the special color-rendering index R9 that shows red color rendering properties with high color saturation can be enhanced in the organic EL element 20 by giving a broad distribution to the emission spectrum in a region of a wavelength of 580 nm or more.

Furthermore, the special color-rendering index R9 that shows red color rendering properties of high color saturation can be enhanced together with the mean color-rendering index Ra, by containing a green light-emitting dopant and a blue light-emitting dopant together with two kinds of red light-emitting dopants each of which exhibits an emission spectrum having a peak at a wavelength of 580 nm or more.

Furthermore, in the same way as the first embodiment, four kinds of light-emitting dopants are contained in the light-emitting layer.

As a result of containing four kinds or more of light-emitting dopants as described above, a superimposed wavelength region in each of emission spectrum of respective light-emitting dopants becomes larger, which makes it possible to give a broad emission spectrum distribution to the organic EL element 20 in the whole wavelength region. Accordingly, even when light emission luminance of one light-emitting dopant changes by degradation with passage of time or by a current density, the luminance may be compensated by light emission of another light-emitting dopant, and influence on the whole of the spectrum of the organic EL element becomes smaller.

Therefore, a white light-emitting element whose chromaticity of white color does not easily change with passage of time can be constituted. Furthermore, a white light-emitting element whose shape of the emission spectrum does not easily depend on a current density can be constituted.

3. Embodiment of Electronic Device (Third Embodiment) [Lighting Device-1]

Next, a lighting device will be explained as an example of an embodiment of electronic devices in which the organic EL elements of the first embodiment and the second embodiment are used.

An organic EL element used in the lighting device of the present embodiment may be designed so as to impart a resonator structure to the each organic EL element of the configuration of the above-described first embodiment or the second embodiment. The objects of using the organic EL element having the resonator structure include a light source for an optical storage medium, a light source for an electrophotographic copier, a light source for an optical communication processor, a light source for an optical sensor, and the like, but is not limited thereto. Alternatively, the organic EL element may be used for the above-described purpose by oscillating laser beam.

Note that materials to be used for the organic EL element can be applied to an organic EL element which emits a substantial white light (also referred to as white organic EL element). For example, the simultaneous emission of a plurality of luminescent colors from a plurality of light-emitting materials can also give a white color emission by color mixing. Examples of the combination of a plurality of luminescent colors may include a combination containing three maximum emission wavelengths of three primary colors of red, green and blue, or a combination containing two maximum emission wavelengths utilizing a complementary color relationship such as blue and yellow, bluish green and orange, or the like.

Furthermore, the combination of light-emitting materials for obtaining a plurality of luminescent colors may be a combination of a plurality of light-emitting materials which emit a plurality of phosphorescence or fluorescence, or a combination of a light-emitting material which emit a plurality of phosphorescence or fluorescence and a material of coloring matter that emits excitation light from a light-emitting material. In the white organic EL element, a plurality of light-emitting dopants may be combined and mixed.

The white color organic EL element has a configuration different from the configuration of obtaining white color emission by arranging, in parallel, organic EL elements each of which emits individual color light, in an array form, and the organic EL element itself can emit white color light. Therefore, it is not necessary to use a mask for forming most of layers constituting the element. Therefore, for example, an electroconductive layer can be formed all over by a vapor deposition method, a casting method, a spin coating method, an ink-jet method, a printing method, and the like, which enhances productivity.

Furthermore, the light-emitting material used for the light-emitting layers of the white color organic EL element is not particularly limited, and as to, for example, a backlight in a liquid crystal display element, whitening may be performed by selection and combination of arbitrary materials from among the metal complexes described in the embodiments of the above-described organic EL element or well-known light-emitting materials so as to be suited to a wavelength range corresponding to a CF (color filter) properties.

It is possible to produce a lighting device which emits substantial white light, by using the white color organic EL element explained above.

[Lighting Device-2]

Furthermore, in the lighting device, it is also possible to make the area of the light emission surface large, for example, by the use of a plurality of organic EL elements. In this case, the light-emitting area can be enlarged by arranging (namely, tiling), on a support substrate, a plurality of light-emitting panels provided with the organic EL elements on a transparent substrate. The support substrate may also double as a sealing member, and the light-emitting panels are tiled in a state where the organic EL elements are sandwiched between the support substrate and a base material of the light-emitting panel. The organic EL element may be sealed by filling an adhesive between the support substrate and the base material of. Note that terminals of a transparent electroconductive body and a counter electrode are exposed around the light-emitting panel.

In the lighting device having such a configuration, a non-light-emitting region is generated between the light-emitting panels since the center region of the light-emitting panel serves as the light-emitting region. Therefore, in order to increase an amount of light to be extracted from the non-light-emitting region, a light extraction member may be provided in the non-light-emitting region of a light extraction surface. Alight condensing sheet or a light diffusing sheet can be used as the light extraction member.

EXAMPLE

Hereinafter, the present invention will be specifically explained by giving Examples, but the present invention is not limited to these.

<Production of Organic EL Element>

Figure 5:
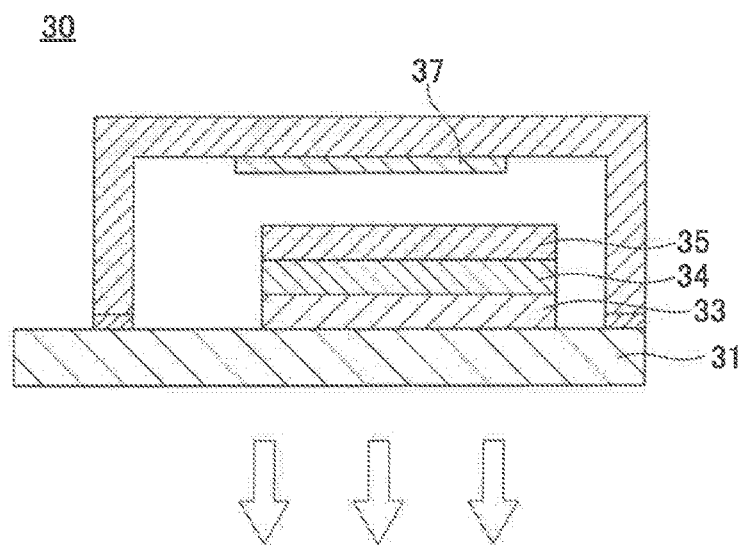
FIG. 5 is a cross-sectional view showing a schematic configuration of the organic EL element that was produced in Example.

An organic EL element having a configuration as shown in FIGS. 4 and 5 was produced by the following method. FIG. 4 shows a schematic view of the organic EL element, and FIG. 5 shows a cross-sectional diagram of the organic EL element.

An organic EL element 30 shown in FIGS. 4 and 5 is covered with a glass substrate 31 and a glass cover 32. A sealing operation with the glass cover 32 was carried out in a glove box under a nitrogen atmosphere (under an atmosphere of high purity nitrogen gas having purity of 99.999% or more) without bringing the organic EL element into contact with the air.

Furthermore, as shown in FIG. 5, a transparent electrode 33, a light-emitting unit 34, and a cathode 35 are laminated and formed on the glass substrate 31. The glass cover 32 is filled with nitrogen gas and a moisture-capturing agent 37 is provided.

[Production of Organic EL Element of Sample 101]
(Anode)

A glass substrate of 30 mm×30 mm, thickness 0.7 mm was prepared as a transparent support substrate. Then, on the transparent support substrate, an ITO (indium tin oxide) film was formed in a thickness of 150 nm, which was patterned, and thus an anode being made of an ITO transparent electrode is formed. After that, the transparent support substrate to which the ITO transparent electrode was attached was subjected to ultrasonic cleaning with isopropyl alcohol, was dried by dry nitrogen gas, and was then subjected to UV ozone cleaning for five minutes.

(First Light-Emitting Unit)

Next, the transparent support substrate obtained by forming the anode was fixed to a substrate holder of a commercially available vacuum vapor deposition apparatus. Then, materials of respective layers for constituting a first light-emitting unit were charged into respective crucibles for vapor deposition in the vacuum vapor deposition apparatus in an amount optimal for producing an element. A crucible for vapor deposition being made of a material for resistance heating of molybdenum or tungsten was used as the respective crucibles for vapor deposition.

After the pressure in the vacuum vapor deposition apparatus was reduced to a vacuum degree of $1 \times 10^{-4}$ Pa, electric power was applied to a crucible for vapor deposition containing a compound M-1 indicated by a structural formula as shown below to thereby heat the crucible, and the compound was vapor-deposited onto the glass substrate at a vapor deposition rate of 0.1 nm/sec, with the result that a layer having a thickness of 15 nm was formed.

[Chem.1]

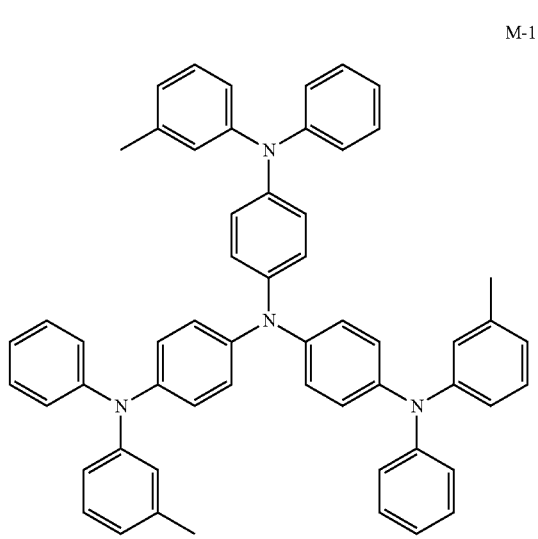

M-1

Next, a compound M-2 indicated by a structural formula below was vapor-deposited in the same way, and thus a layer having a thickness of 15 nm was formed.

[Chem. 2]

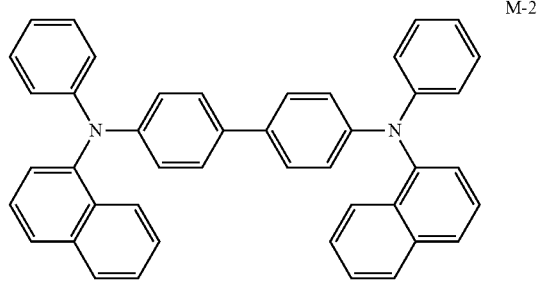

M-2

Subsequently, a compound RD-1 and a compound H-1 indicated by structural formulae below were co-vapor deposited at a vapor deposition rate of 0.1 nm/sec so that the concentration of the compound RD-1 was 15%, and thus a phosphorescent light-emitting layer (first light-emitting layer) having a thickness of 30 nm and emitting red light was formed. The compound RD-1 is a light-emitting dopant having an emission peak near 605 nm.

[Chem. 3]

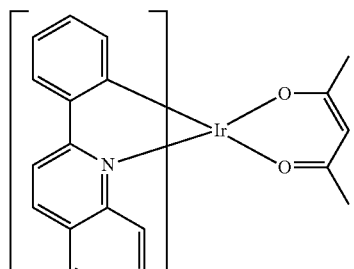

Ir(phq)₂(acac)

RD-1

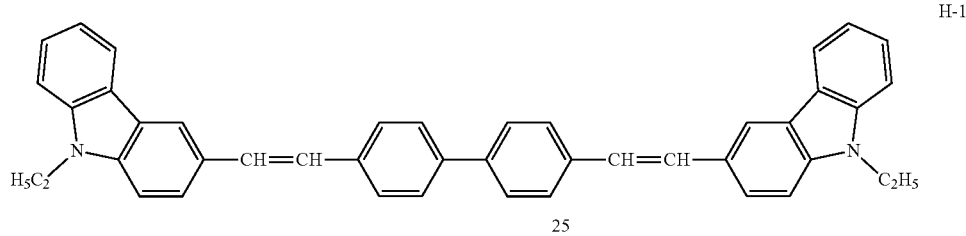

H-1

Then, a compound BD-1 indicated by a structural formula below as a blue light-emitting dopant and the compound H-1 were co-vapor deposited at a vapor deposition rate of 0.1 nm/sec so that the concentration of the compound RD-1 was 5%, and thus there was formed a fluorescent light-emitting layer (second light-emitting layer) having a thickness of 30 nm and emitting blue light.

[Chem. 4]

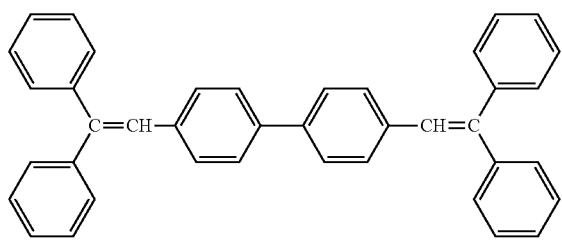

BD-1

Next, a compound E-1 indicated by a structural formula below was vapor-deposited at a vapor deposition rate of 0.1 nm/sec, and thus a layer having a thickness of 20 nm was formed.

[Chem. 5]

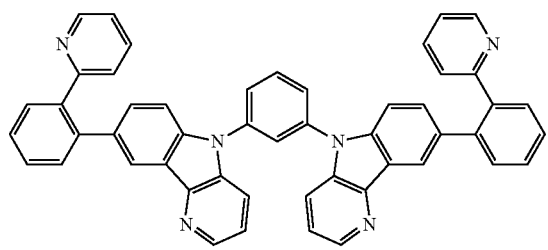

E-1

(Intermediate Connector Layer)

The compound E-1 and NDN-26 manufactured by Novaled were co-vapor deposited as an intermediate connector layer so that the concentration of the NDN-26 was 5 mass % and so as to have a thickness of 25 nm at a vapor deposition rate of 0.1 nm/sec, and thus a layer having a thickness of 20 nm was formed. Thereby, there were formed electron transport properties obtained by adding an electron-donating substance.

Accordingly, the compound M-2 and NDP-9 manufactured by Novaled were co-vapor deposited at a vapor deposition rate of 0.1 nm/sec so that a volume ratio between them was 50:50, and thus a layer having a thickness of 10 nm was formed. Thereby, there were formed positive-positive hole transport properties obtained by adding an electron-accepting substance.

(Second Light-Emitting Unit)

Then, the compound M-2 was vapor-deposited at a vapor deposition rate of 0.1 nm/sec, and thus a layer having a thickness of 50 nm was formed.

Next, a compound GD-1 indicated by a structural formula below as a green light-emitting dopant and the compound H-1 were co-vapor deposited at a vapor deposition rate of 0.1 nm/sec so that the concentration of the compound GD-1 was 15%, and thus there was formed a phosphorescent light-emitting layer (third light-emitting layer) having a thickness of 30 nm and emitting green light.

Subsequently, a compound RD-2 indicated by a structural formula below and the compound H-1 were co-vapor deposited at a vapor deposition rate of 0.1 nm/sec so that the concentration of the compound RD-2 was 15%, and thus there was formed a phosphorescent light-emitting layer (fourth light-emitting layer) having a thickness of 30 nm and emitting red light. The compound RD-2 is a light-emitting dopant having an emission peak near 620 nm.

After that, the compound E-1 was vapor-deposited at a vapor deposition rate of 0.1 nm/sec, and thus a layer having a thickness of 35 nm was formed.

Next, LiF was formed in a thickness of 1.5 nm.

[Chem. 6]

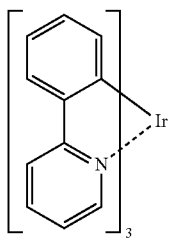

GD-1

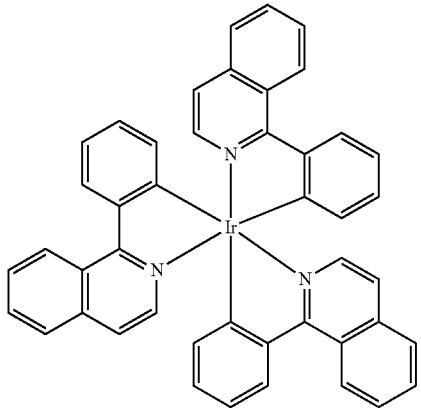

RD-2

(Cathode and Sealing)

Next, a cathode was formed by vapor deposition of aluminum having a thickness of 110 nm.

Next, the non-light-emitting surface of the above-described element was covered with a glass case, and finally, a light condensing sheet was stuck to the light extraction side of the substrate, with the result that an organic EL element of the sample 101 having the configuration as shown in FIGS. 4 and 5 was produced.

[Production of Organic EL Elements of Samples 102 to 115]

In the production process of the organic EL element of the sample 101, light-emitting dopants each contained in the first to fourth light-emitting layers of the first light-emitting unit and the second light-emitting unit were changed as described in Table 1, and thus organic EL elements of samples 102 to 115 were produced.

Furthermore, in the organic EL elements of samples 110 to 112, after there was formed electron transport properties obtained by adding an electron-donating substance as an intermediate connector layer, lithium was vapor-deposited in a thickness of 1 nm, and thus a metal single layer was formed.

Except for this, organic EL elements of samples 102 to 115 were produced in the same way as that of the production of the organic EL element of the sample 101.

[Chem. 7]

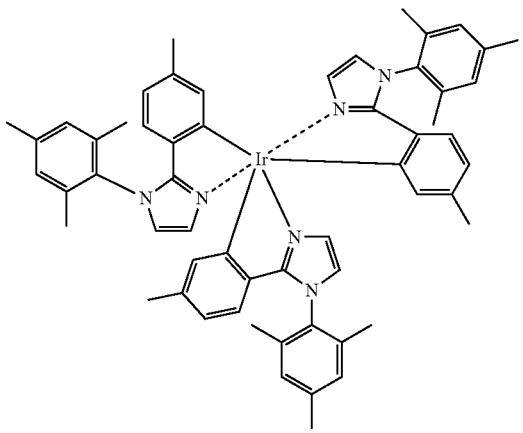

BD-2

[Production of Organic EL Element of Sample 116]

in the production of organic EL element of the sample 115, the first light-emitting unit was changed as described below, and thus an organic EL element of a sample 116 was produced.

The compound GD-1, the compound RD-2, and the compound H-1 were co-vapor deposited at a vapor deposition rate of 0.1 nm/sec so that the concentration of the compound GD-1 was 15% and the concentration of the compound RD-2 was 1.5%, and thus there was formed a phosphorescent light-emitting layer having a thickness of 30 nm and emitting green light and red light.

[Production of Organic EL Element of Sample 117]

In the production of organic EL element of the sample 101, the process of forming the anode and subsequent processes of forming the cathode were changed as described below, and thus an organic EL element of a sample 117 was produced.

On the transparent support substrate on which the anode was formed, the compound GD-1, the compound RD-1 and the compound H-1 were co-vapor deposited at a vapor deposition rate of 0.1 nm/sec so that the concentration of the compound GD-1 was 15% and the concentration of the compound RD-1 was 1.5%, and thus there was formed a phosphorescent light-emitting layer having a thickness of 30 nm and emitting green light and red light Next, the compound BD-1, the compound RD-2 and the compound H-1 were co-vapor deposited at a vapor deposition rate of 0.1 nm/sec so that the concentration of the compound BD-1 was 15% and the concentration of the compound RD-2 was 1.5%, and thus there was formed a phosphorescent light-emitting layer having a thickness of 30 nm and emitting blue light and red light.

After that, the compound E-1 was vapor-deposited at a vapor deposition rate of 0.1 nm/sec, and thus a layer having a thickness of 35 nm was formed. Then, LiF was formed in a thickness of 1.5 nm.

Furthermore, a cathode was formed by vapor deposition of aluminum having a thickness of 110 nm.

[Production of Organic EL Element of Sample 118]

In the production of the organic EL element of the sample 101, the RD-1 in the first light-emitting unit was changed to an OD-1 indicated by a structural formula below, as described in Table 1, and thus an organic EL element of a sample 118 was produced. Here, the OD-1 has an emission peak near 560 nm. Except for this, an organic EL element of sample 118 was produced in the same way as that of the production of the organic EL element of the sample 101.

[Chem. 8]

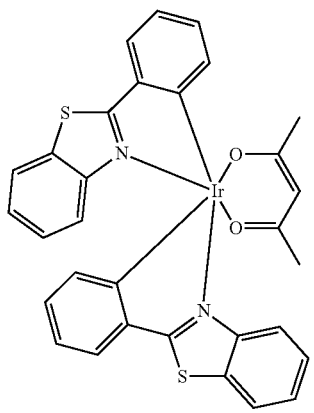

OD-1

In Table 1 below, configurations of the organic EL elements of samples 101 to 118 are shown.

[Evaluation]

The organic EL elements of samples 101 to 118 obtained as described above were evaluated in terms of element properties as described below. Evaluation results of respective samples are shown in Table 2.

(Quantum Efficiency of External Extraction, Drive Voltage, Power Efficiency, Mean Color-Rendering Index Ra, and Special Color-Rendering Index R9)

There was measured quantum efficiency of external extraction, drive voltage, power efficiency, mean color-rendering index Ra, and special color-rendering index R9 when a constant current of 2.5 mA/cm$^2$ was applied to organic EL elements of samples 101 to 118 produced. A spectral radiance luminance meter CS-2000 (manufactured by Konica Minolta Sensing) was used for the measurement.

Evaluation results of respective samples are shown by relative values while the measurement value of the organic EL element of the sample 101 is set to 100.

(Evaluation of Chromaticity Stability when Current Density Changes)

There were measured chromaticity when current density of 1 mA/cm$^2$ was given and chromaticity when current

TABLE 1

| SAMPLE | FIRST LIGHT-EMITTING UNIT | | | | INTERMEDIATE CONNECTOR LAYER |
|---|---|---|---|---|---|
| | LIGHT-EMITTING DOPANT | LIGHT-EMITTING PHENOMENON | LIGHT-EMITTING DOPANT | LIGHT-EMITTING PHENOMENON | METAL SINGLE LAYER |
| 101 | RD-1 | PHOSPHORESCENT LIGHT | BD-1 | FLUORESCENT LIGHT | — |
| 102 | RD-2 | PHOSPHORESCENT LIGHT | BD-1 | FLUORESCENT LIGHT | — |
| 103 | GD-1 | PHOSPHORESCENT LIGHT | BD-1 | FLUORESCENT LIGHT | — |
| 104 | RD-1 | PHOSPHORESCENT LIGHT | BD-2 | PHOSPHORESCENT LIGHT | — |
| 105 | RD-2 | PHOSPHORESCENT LIGHT | BD-2 | PHOSPHORESCENT LIGHT | — |
| 106 | GD-1 | PHOSPHORESCENT LIGHT | BD-2 | PHOSPHORESCENT LIGHT | — |
| 107 | RD-2 | PHOSPHORESCENT LIGHT | RD-1 | PHOSPHORESCENT LIGHT | — |
| 108 | GD-1 | PHOSPHORESCENT LIGHT | RD-1 | PHOSPHORESCENT LIGHT | — |
| 109 | GD-1 | PHOSPHORESCENT LIGHT | RD-2 | PHOSPHORESCENT LIGHT | — |
| 110 | RD-2 | PHOSPHORESCENT LIGHT | RD-1 | PHOSPHORESCENT LIGHT | Li |
| 111 | GD-1 | PHOSPHORESCENT LIGHT | RD-1 | PHOSPHORESCENT LIGHT | Li |
| 112 | GD-1 | PHOSPHORESCENT LIGHT | RD-2 | PHOSPHORESCENT LIGHT | Li |
| 113 | RD-2 | PHOSPHORESCENT LIGHT | RD-1 | PHOSPHORESCENT LIGHT | — |
| 114 | GD-1 | PHOSPHORESCENT LIGHT | RD-1 | PHOSPHORESCENT LIGHT | — |
| 115 | GD-1 | PHOSPHORESCENT LIGHT | RD-2 | PHOSPHORESCENT LIGHT | — |
| 116 | GD-1 | PHOSPHORESCENT LIGHT | RD-2 | PHOSPHORESCENT LIGHT | — |
| 117 | GD-1 | PHOSPHORESCENT LIGHT | BD-1 | FLUORESCENT LIGHT | — |
| | RD-1 | PHOSPHORESCENT LIGHT | RD-2 | PHOSPHORESCENT LIGHT | |
| 118 | OD-1 | PHOSPHORESCENT LIGHT | BD-1 | PHOSPHORESCENT LIGHT | — |

| SAMPLE | SECOND LIGHT-EMITTING UNIT | | | |
|---|---|---|---|---|
| | LIGHT-EMITTING DOPANT | LIGHT-EMITTING PHENOMENON | LIGHT-EMITTING DOPANT | LIGHT-EMITTING PHENOMENON |
| 101 | GD-1 | PHOSPHORESCENT LIGHT | RD-2 | PHOSPHORESCENT LIGHT |
| 102 | GD-1 | PHOSPHORESCENT LIGHT | RD-1 | PHOSPHORESCENT LIGHT |
| 103 | RD-2 | PHOSPHORESCENT LIGHT | RD-1 | PHOSPHORESCENT LIGHT |
| 104 | GD-1 | PHOSPHORESCENT LIGHT | RD-2 | PHOSPHORESCENT LIGHT |
| 105 | GD-1 | PHOSPHORESCENT LIGHT | RD-1 | PHOSPHORESCENT LIGHT |
| 106 | RD-2 | PHOSPHORESCENT LIGHT | RD-1 | PHOSPHORESCENT LIGHT |
| 107 | GD-1 | PHOSPHORESCENT LIGHT | BD-1 | FLUORESCENT LIGHT |
| 108 | RD-2 | PHOSPHORESCENT LIGHT | BD-1 | FLUORESCENT LIGHT |
| 109 | RD-1 | PHOSPHORESCENT LIGHT | BD-1 | FLUORESCENT LIGHT |
| 110 | GD-1 | PHOSPHORESCENT LIGHT | BD-1 | FLUORESCENT LIGHT |
| 111 | RD-2 | PHOSPHORESCENT LIGHT | BD-1 | FLUORESCENT LIGHT |
| 112 | RD-1 | PHOSPHORESCENT LIGHT | BD-1 | FLUORESCENT LIGHT |
| 113 | GD-1 | PHOSPHORESCENT LIGHT | BD-2 | PHOSPHORESCENT LIGHT |
| 114 | RD-2 | PHOSPHORESCENT LIGHT | BD-2 | PHOSPHORESCENT LIGHT |
| 115 | RD-1 | PHOSPHORESCENT LIGHT | BD-2 | PHOSPHORESCENT LIGHT |
| 116 | RD-1 | PHOSPHORESCENT LIGHT | BD-2 | PHOSPHORESCENT LIGHT |
| 117 | — | — | — | — |
| 118 | GD-1 | PHOSPHORESCENT LIGHT | RD-2 | PHOSPHORESCENT LIGHT | density of 2 mA/cm² was given to organic EL elements of samples 101 to 118, by using a spectral radiance luminance meter CS-2000 (manufactured by Konica Minolta Sensing), and the chromaticity difference ΔE between them was obtained by a formula below. Note that, in the formula below, x, y are chromaticity x, y in the CIE 1931 color specification system.

$$\Delta E = (\Delta x^2 + \Delta y^2)^{1/2}$$

(Emission Lifetime)

Current is applied to organic EL elements of samples 101 to 118 so as to give a front luminance of 4000 cd/m² to thereby continuously drive the organic EL elements, and there was obtained time required until the front luminance became the half of the initial value (2000 cd/m²), which was defined as an emission lifetime.

Evaluation results of respective samples are shown by relative values when the measurement value of the organic EL element of the sample 101 is set to 100.

(Evaluation of Chromaticity Stability with Passage of Time in Driving)

The front luminance 4000 cd/m² was set as the initial luminance and luminance variation in continuous driving was tracked. Chromaticity at t=0 and chromaticity when the luminance reduced by half were measured with a spectral radiance luminance meter CS-2000 (manufactured by Konica Minolta Sensing), and the difference ΔE between these was obtained by a formula below. In the formula below, x, y are chromaticity x, y in the CIE 1931 color specification system.

$$\Delta E = (\Delta x^2 + \Delta y^2)^{1/2}$$

dopant and green light-emitting dopant has an enhanced mean color-rendering index Ra and special color-rendering index R9.

Therefore, it is known that, when two kinds of light-emitting dopants each having a peak in a region of a wavelength of 580 nm or more are contained, the mean color-rendering index Ra and special color-rendering index R9 of the organic EL element are enhanced.

In addition, when comparison is made among samples 101 to 117 and the sample 118, although all of which contain four kinds of light-emitting dopants that are different in peak wavelengths, samples 101 to 117 containing two kinds of light-emitting dopants each having a peak in a region of a wavelength of 580 nm or more exert influence of change in current density and of passage of time on the chromaticity smaller than that in the sample 118 containing only one kind of light-emitting dopant having a peak in a region of a wavelength of 580 nm or more, from which it is known that, in the former, color change of the organic EL element is suppressed.

Namely, the emission spectrum of light extracted from the organic EL element is distributed in a broad wavelength region by containing two kinds of light-emitting dopants each having a peak in a region of a wavelength of 580 nm or more, and thus the influence of change in current density and of passage of time on the chromaticity can be suppressed and the change in color of the organic EL element can be suppressed.

In the samples 103, 106, 107, 110 and 113, two kinds of light-emitting dopants each having a peak in a region of a wavelength of 580 nm or more are contained in the same light-emitting unit. These samples have a higher drive

TABLE 2

| SAMPLE | QUANTUM EFFICIENCY OF EXTERNAL EXTRACTION | DRIVE VOLTAGE | POWER EFFICIENCY | COLOR-RENDERING INDEX Ra | COLOR-RENDERING INDEX R9 | CHROMATICITY STABILITY WHEN CURRENT DENSITY CHANGES (ΔE) | EMISSION LIFETIME | CHROMATICITY STABILITY WITH PASSAGE OF TIME IN DRIVING (ΔE) |
|---|---|---|---|---|---|---|---|---|
| 101 | 100 | 100 | 100 | 100 | 100 | 0.02 | 100 | 0.02 |
| 102 | 109 | 98 | 114 | 101 | 99 | 0.03 | 112 | 0.04 |
| 103 | 103 | 121 | 88 | 102 | 99 | 0.01 | 106 | 0.01 |
| 104 | 136 | 100 | 137 | 102 | 101 | 0.03 | 137 | 0.03 |
| 105 | 134 | 98 | 140 | 99 | 97 | 0.01 | 137 | 0.01 |
| 106 | 125 | 118 | 109 | 101 | 98 | 0.02 | 129 | 0.03 |
| 107 | 138 | 118 | 118 | 102 | 101 | 0.03 | 137 | 0.03 |
| 108 | 147 | 101 | 148 | 102 | 100 | 0.01 | 150 | 0.01 |
| 109 | 141 | 98 | 148 | 99 | 96 | 0.03 | 145 | 0.04 |
| 110 | 119 | 119 | 101 | 103 | 102 | 0.01 | 100 | 0.01 |
| 111 | 128 | 101 | 129 | 101 | 99 | 0.02 | 131 | 0.02 |
| 112 | 122 | 99 | 127 | 102 | 99 | 0.01 | 126 | 0.01 |
| 113 | 156 | 120 | 132 | 102 | 101 | 0.03 | 158 | 0.03 |
| 114 | 159 | 97 | 168 | 99 | 97 | 0.01 | 163 | 0.01 |
| 115 | 166 | 99 | 172 | 101 | 98 | 0.02 | 171 | 0.03 |
| 116 | 164 | 84 | 201 | 101 | 98 | 0.02 | 169 | 0.03 |
| 117 | 75 | 102 | 74 | 100 | 102 | 0.06 | 76 | 0.07 |
| 118 | 78 | 101 | 80 | 56 | 40 | 0.10 | 80 | 0.13 |

Samples 101 to 117 that contain two kinds of light-emitting dopants each having a peak in a region of a wavelength of 580 nm or more have an enhanced mean color-rendering index Ra and special color-rendering index R9, as compared with the sample 118 that contains only one kind of light-emitting dopant having a peak in a region of a wavelength of 580 nm or more.

Furthermore, as is the case for the sample 117, also the configuration in which one light-emitting unit contains four kinds of light-emitting dopants, that is, two kinds of light-emitting dopants each having a peak in a region of a wavelength of 580 nm or more and a blue light-emitting voltage than the sample 101. It is considered that this is because only light-emitting dopants each having a peak in a region of a wavelength of 580 nm or more with low carrier transport properties are contained in the light-emitting unit and thus carrier transport properties of the light-emitting unit are lowered.

Furthermore, also in the sample 117 having only one light-emitting unit, the drive voltage is higher than that of the sample 101 as a result of containing two kinds of light-emitting dopants each having a peak in a region of a wavelength of 580 nm or more in the same light-emitting unit.

On the other hand, distinct rise in the drive voltage is not generated, in samples 102 etc. in which a light-emitting dopant having a peak in a region of a wavelength of 580 nm or more and another light-emitting dopant are contained in the same light-emitting unit.

Accordingly, it is known that the drive voltage can be lowered as a result of the fact that a light-emitting dopant having a peak in a region of a wavelength of 580 nm or more and another light-emitting dopant are contained in the same light-emitting unit.

The sample 102 and the sample 105 have enhanced power efficiency, when comparison is made between the sample 101 and the sample 102, and comparison is made between the sample 104 and the sample 105, in which positions of light-emitting layers each containing the RD-1 having a peak wavelength of 605 nm and the RD-2 having a peak wavelength of 620 nm as two kinds of light-emitting dopants each having a peak in a region of a wavelength of 580 nm or more are different from each other.

Samples 101 and 104 have a configuration in which the RD-2 having a peak wavelength of 620 nm is contained in the fourth light-emitting layer that is formed on a side closest to the cathode of the second light-emitting unit, of two kinds of light-emitting dopants each having a peak in a region of a wavelength of 580 nm or more. On the other hand, samples 102 and 105 have a configuration in which the RD-1 is contained in the fourth light-emitting layer that is formed on the side closest to the cathode of the second light-emitting unit.

It is considered that this is because the RD-1 having a peak on the short wavelength side, of two kinds of light-emitting dopants each having a peak in a region of a wavelength of 580 nm or more, is contained in a light-emitting layer on the cathode side and thus the plasmon loss can be suppressed and power efficiency of the organic EL element can be enhanced.

Further, when comparison is made among samples 110 to 112 in which a metal single layer is formed as an intermediate connector layer with samples 107 to 109 without a metal single layer, there was obtained a result in which quantum efficiency of external extraction and emission lifetime of samples 110 to 112 obtained by providing a metal single layer as an intermediate connector layer, were lowered.

From the result, it is known that the quantum efficiency of external extraction is lowered by the generation of the plasmon loss when a metal single layer is included as an intermediate connector layer. It is also known that, without including an intermediate connector layer, a diffusing substance from an intermediate connector layer does not easily exert influence to thereby enhance the emission lifetime of the organic EL element.

Note that the present invention is not to be limited to the configurations explained in the above-described embodiment examples, and various modifications and changes are possible within the scope not departing from the configurations of the present invention.

REFERENCE SIGNS LIST 10, 20, 30: organic EL element, 11, 21: anode, 12: first light-emitting unit, 12A: first light-emitting layer, 13: intermediate connector layer, 14: second light-emitting unit, 14A: second light-emitting layer, 14B: third light-emitting layer, 15, 23, 35: cathode, 16, 24: substrate, 22, 34: light-emitting unit, 31: glass substrate, 32: glass cover, 33: transparent electrode, 37: moisture-capturing agent

The invention claimed is:

1. An organic electroluminescent element, comprising:
an anode;
a cathode;
a light-emitting unit sandwiched between the anode and the cathode; and
two or more light-emitting dopants each of which has a peak wavelength of 580 nm or more contained in the light-emitting unit,
wherein the light-emitting unit comprises two or more light-emitting layers between the anode and the cathode,
a first of the two or more light-emitting layers is closer to the cathode than a second of the two or more light-emitting layers,
the first of the two or more light-emitting layers has a first of the two or more light-emitting dopants each of which has a peak wavelength of 580 nm or more,
the second of the two or more light-emitting layers has a second of the two or more light-emitting dopants each of which has a peak wavelength of 580 nm or more, and
the peak wavelength of the first light-emitting dopant is shorter than the peak wavelength of the second light-emitting dopant.

2. The organic electroluminescent element according to claim 1, wherein two of the two or more light-emitting layers are laminated with an intermediate connector layer therebetween.

3. The organic electroluminescent element according to claim 1, wherein the light-emitting unit comprises a light-emitting layer having one of the two or more light-emitting dopants each of which has a peak wavelength of 580 nm or more and a light-emitting dopant having a peak wavelength of less than 580 nm.

4. The organic electroluminescent element according to claim 2, wherein the intermediate connector is a charge-generating layer or a metal layer.

5. The organic electroluminescent element according to claim 1, wherein all light-emitting dopants contained in the light-emitting unit are phosphorescent light-emitting dopants.

6. An electronic device, comprising the organic electroluminescent element according to claim 1.

* * * * *